(12) United States Patent
Charbonneau-Lefort

(10) Patent No.: US 9,435,963 B2
(45) Date of Patent: Sep. 6, 2016

(54) MISALIGNMENT-TOLERANT TOTAL-INTERNAL-REFLECTION FIBER OPTIC INTERFACE MODULES AND ASSEMBLIES WITH HIGH COUPLING EFFICIENCY

(75) Inventor: Mathieu Charbonneau-Lefort, San Jose, CA (US)

(73) Assignee: CORNING CABLE SYSTEMS LLC, Hickory, NC (US)

( * ) Notice: Subject to any disclaimer, the term of this patent is extended or adjusted under 35 U.S.C. 154(b) by 100 days.

(21) Appl. No.: 13/436,197

(22) Filed: Mar. 30, 2012

(65) Prior Publication Data

US 2013/0259423 A1  Oct. 3, 2013

(51) Int. Cl.
*G02B 6/32* (2006.01)
*G02B 6/42* (2006.01)
*H01S 5/022* (2006.01)
*H01S 5/183* (2006.01)

(52) U.S. Cl.
CPC .............. *G02B 6/4206* (2013.01); *G02B 6/32* (2013.01); *G02B 6/423* (2013.01); *G02B 6/4224* (2013.01); *G02B 6/4214* (2013.01); *H01S 5/02252* (2013.01); *H01S 5/02284* (2013.01); *H01S 5/02292* (2013.01); *H01S 5/183* (2013.01)

(58) Field of Classification Search
CPC ....................................................... G02B 6/32
See application file for complete search history.

(56) References Cited

U.S. PATENT DOCUMENTS

| | | | |
|---|---|---|---|
| 4,344,668 A | 8/1982 | Gunther et al. | 350/334 |
| 4,666,238 A * | 5/1987 | Borsuk et al. | 385/79 |
| 4,998,794 A * | 3/1991 | Holzman | 385/33 |
| 5,511,140 A * | 4/1996 | Cina | G02B 6/4204 359/362 |
| 5,555,331 A | 9/1996 | Billet et al. | 385/49 |
| 5,659,643 A | 8/1997 | Appeldorn et al. | 385/31 |
| 6,198,864 B1 | 3/2001 | Lemoff et al. | |
| 6,257,771 B1 | 7/2001 | Okayasu | 385/89 |
| 6,257,772 B1 * | 7/2001 | Nakanishi et al. | 385/89 |
| 6,328,484 B1 * | 12/2001 | Uebbing | 385/93 |
| 6,488,417 B2 | 12/2002 | Kropp | |
| 6,491,447 B2 | 12/2002 | Aihara | |
| 6,751,376 B2 | 6/2004 | Hammond | 385/31 |

(Continued)

FOREIGN PATENT DOCUMENTS

| | | |
|---|---|---|
| CN | 101147088 A | 3/2008 |
| EP | 0613032 A2 | 11/1994 |

(Continued)

OTHER PUBLICATIONS

Parks, et al., "Passively Aligned Transmit Optical Subassembly Module Based on a WDM Incorporating VCSELs," IEEE Photonics Technology Letters, vol. 22, p. 1790, 2010.

(Continued)

*Primary Examiner* — Charlie Y Peng

(57) ABSTRACT

Fiber optic interface modules and assemblies using same are disclosed, wherein the modules and assemblies are tolerant to misalignment and have a high coupling efficiency. The module has at least one lens that defines a folded optical path through the module body. The folded optical path is formed by total internal reflection within the module body from an angled wall of the module. The lens has an aspheric front surface and a planar rear surface and is configured to have an optimum tolerance to a lateral misalignment relative to a light source while maintaining a high coupling efficiency between the light source and an optical fiber.

26 Claims, 18 Drawing Sheets

(56) References Cited

U.S. PATENT DOCUMENTS

| | | | |
|---|---|---|---|
| 6,813,418 B1* | 11/2004 | Kragl | G02B 6/4214 385/39 |
| 6,874,950 B2 | 4/2005 | Colgan et al. | 385/88 |
| 6,876,790 B2* | 4/2005 | Lee | G02B 6/4206 385/33 |
| 6,921,214 B2* | 7/2005 | Wilson | G02B 6/4204 385/89 |
| 6,952,508 B2 | 10/2005 | Simons et al. | 385/31 |
| 6,956,995 B1 | 10/2005 | Shafaat et al. | 385/39 |
| 7,066,657 B2* | 6/2006 | Murali | G02B 6/4214 385/49 |
| 7,329,054 B1* | 2/2008 | Epitaux | G02B 6/4249 385/89 |
| 7,399,125 B1* | 7/2008 | Whaley | G02B 6/4204 385/88 |
| 7,543,994 B2* | 6/2009 | McColloch | G02B 6/4214 385/115 |
| 7,547,151 B2* | 6/2009 | Nagasaka | G02B 6/4214 385/53 |
| 7,630,593 B2 | 12/2009 | Furuno et al. | 385/14 |
| 7,680,376 B2 | 3/2010 | Goebel et al. | |
| 7,773,836 B2 | 8/2010 | De Dobbelaere | 385/14 |
| 8,165,432 B2 | 4/2012 | Ohta et al. | 385/15 |
| 8,295,671 B2 | 10/2012 | DeMeritt et al. | |
| 8,315,492 B2 | 11/2012 | Chen et al. | 385/33 |
| 8,641,296 B2 | 2/2014 | Nishimura | |
| 8,913,858 B2 | 12/2014 | Charbonneau-Lefort et al. | |
| 9,052,478 B2 | 6/2015 | Charbonneau-Lefort | |
| 2001/0004413 A1* | 6/2001 | Aihara | 385/88 |
| 2001/0053260 A1 | 12/2001 | Takizawa et al. | 385/14 |
| 2002/0076152 A1 | 6/2002 | Hughes et al. | 385/35 |
| 2002/0126335 A1 | 9/2002 | Dieckroger et al. | 359/110 |
| 2003/0044119 A1 | 3/2003 | Sasaki et al. | 385/49 |
| 2003/0142896 A1 | 7/2003 | Kikuchi et al. | 385/14 |
| 2004/0033016 A1 | 2/2004 | Kropp | 385/31 |
| 2004/0234210 A1 | 11/2004 | Nagasaka et al. | 385/88 |
| 2005/0141823 A1* | 6/2005 | Han | G02B 6/4204 385/89 |
| 2008/0068719 A1 | 3/2008 | Hayashi et al. | 385/622 |
| 2009/0169163 A1* | 7/2009 | Abbott et al. | 385/127 |
| 2010/0142886 A1 | 6/2010 | Warashina et al. | 385/14 |
| 2010/0272403 A1* | 10/2010 | Chen et al. | 385/93 |
| 2011/0108716 A1 | 5/2011 | Shiraishi | 250/227.24 |
| 2011/0123150 A1 | 5/2011 | Zbinden et al. | 385/33 |
| 2011/0123151 A1 | 5/2011 | Zbinden et al. | 385/33 |
| 2011/0134679 A1 | 6/2011 | Suh et al. | 365/64 |
| 2011/0317959 A1 | 12/2011 | Ohta et al. | 385/38 |
| 2012/0027346 A1 | 2/2012 | Castagna et al. | |
| 2012/0189254 A1 | 7/2012 | Wang et al. | 385/93 |
| 2012/0213475 A1* | 8/2012 | Selli | G02B 6/4214 385/33 |
| 2013/0266259 A1* | 10/2013 | Bhagavatula | G02B 6/32 385/33 |
| 2014/0119690 A1* | 5/2014 | Matsumoto | G02B 6/4214 385/14 |

FOREIGN PATENT DOCUMENTS

| | | | |
|---|---|---|---|
| EP | 1109041 A1 | 6/2001 | |
| EP | 1345059 A1 | 9/2003 | |
| JP | 2001-51162 A | 2/2001 | G02B 6/42 |
| JP | 2001-174671 A | 6/2001 | G02B 6/42 |
| JP | 2005-31556 A | 2/2005 | G02B 6/32 |
| JP | 2006-23777 A | 1/2006 | G02B 6/42 |
| JP | 2007-121973 A | 5/2007 | G02B 6/42 |
| WO | WO2006/088859 A2 | 8/2006 | |
| WO | 2010/036684 A2 | 4/2010 | |

OTHER PUBLICATIONS

Patent Cooperation Treaty, International Search Report for PCT/US2013/033995, Jul. 22, 2013, 12 pages.
Patent Cooperation Treaty, International Search Report for PCT/US2013/033998, Jul. 1, 2013, 11 pages.
Patent Cooperation Treaty, International Search Report for PCT/US2013/034035, Jun. 24, 2013, 11 pages.
EP Written Opinion, issued in corresponding EP Appln. No. 13714830.0, dated Nov. 20, 2014.
Chinese Search Report for Application No. 2013800229137, dated Jun. 24, 2015, 2 pages.

* cited by examiner

MISALIGNMENT-TOLERANT TOTAL-INTERNAL-REFLECTION FIBER OPTIC INTERFACE MODULES AND ASSEMBLIES WITH HIGH COUPLING EFFICIENCY

PRIORITY

This application is related to U.S. patent application Ser. No. 13/436,165, filed Mar. 30, 2012, now U.S. Pat. No. 8,913,858, and to U.S. patent application Ser. No. 13/436,108, filed Mar. 30, 2012, now U.S. Pat. No. 9,052,478, and which applications are incorporated by reference herein.

FIELD

The present disclosure relates to fiber optic interface modules and assemblies, and in particular to such modules and assemblies that employ total internal reflection.

BACKGROUND ART

Short-distance data links used for consumer electronics are reaching increasingly higher data rates, especially those used for video and data storage applications. Examples include the USB 3.0 protocol at 5 Gb/s, HDMI at 10 Gb/s and Thunderbolt at 10 Gb/s over two channels. At such high data rates, traditional copper cables have limited transmission distance and cable flexibility. For at least these reasons, optical fiber is emerging as an alternative to copper wire for accommodating the high data rates for the next generations of consumer electronics.

Unlike telecommunication applications that employ expensive, high-power edge-emitting lasers along with modulators, short-distance optical fiber links are based on low-cost, low-power, directly modulated light sources such as vertical-cavity surface-emitting lasers (VCSELs). To be viable for consumer electronics, the fiber optic interface modules and assemblies used to couple light from the light source into an optical fiber in one direction and light traveling in another optical fiber onto the photodiode in the other direction need to be low-cost. This requirement drives the need for the design of fiber optic interface modules and assemblies to be simple to manufacture while having suitable performance. Thus, there is an unresolved need for fiber optic interface modules having forgiving misalignment tolerances and a passive alignment process.

SUMMARY

An aspect of the disclosure is a fiber optic interface module configured to provide optical communication of infrared light between a light source and an optical fiber having an end and a core. The module includes a module body that is substantially transparent to light having an infrared wavelength and that includes a top surface and a bottom surface, wherein the top surface includes a total-internal-reflection (TIR) mirror, an end wall, and an optical fiber support feature that supports the optical fiber with the optical fiber end abutting the end wall. The module has a lens surface formed on the bottom surface of the module body, wherein the lens surface, the TIR mirror, the end wall and an intervening portion of the module body define a lens having a folded optical axis that can be laterally offset from the light source by a lateral misalignment $\delta Z$. The lens surface has a shape that provides a theoretical coupling efficiency of $CE \geq 90\%$ between the light source and the optical fiber and that defines a back focus that falls within the optical fiber core at a back focus distance F2 in the range of $0 \leq F2 \leq 500$ μm when the optical fiber is operably supported in the optical fiber support feature.

Another aspect of the disclosure is the aforementioned fiber optic interface module, wherein the back focus distance F2 is in the range of $0 \leq F2 \leq 200$ μm.

Another aspect of the disclosure is the aforementioned fiber optic interface module, wherein the lens shape is selected to provide a maximum tolerance to the lateral misalignment $\delta Z$ that maintains the coupling efficiency $CE \geq 85\%$.

Another aspect of the disclosure is the aforementioned fiber optic interface module, wherein the lens surface has a hyperbolic shape.

Another aspect of the disclosure is the aforementioned fiber optic interface module, wherein the lens surface shape is defined by a radius R in the range of 80 microns $\leq R \leq 300$ microns.

Another aspect of the disclosure is the aforementioned fiber optic interface module, further including the optical fiber core having a parabolic gradient-index profile.

Another aspect of the disclosure is a lens for coupling infrared light from a light source having a light-source axis to an optical fiber having an end and a core with a central axis that is substantially orthogonal to the light-source axis. The lens includes, along an optical axis, a lens body having a front lens surface with an aspherical shape and that constitutes an only surface having optical power and an only air interface for an optical path between the light source and the optical fiber. The lens body has a planar rear lens surface against which the optical fiber end abuts, and also has a TIR surface formed therein between the front and rear lens surfaces that folds the lens axis so that the lens axis aligns with the orthogonal light source and central axes. The lens has a back focus that resides within the optical fiber core.

Another aspect of the disclosure is the aforementioned lens, wherein the back focus distance F2 is in the range of 0 microns $\leq F2 \leq 500$ microns.

Another aspect of the disclosure is the aforementioned lens, wherein the back focus distance F2 is in the range of 0 microns $\leq F2 \leq 200$ microns.

Another aspect of the disclosure is the aforementioned lens, wherein the aspherical shape is hyperbolic.

Another aspect of the disclosure is the aforementioned lens, wherein lens couples light into and optical fiber. As one example of an optical fiber design the core of the optical fiber can have parabolic gradient-index profile.

Another aspect of the disclosure is the aforementioned lens, wherein the front lens surface has a shape defined by a radius R in the range of 80 microns $\leq R \leq 300$ microns.

Another aspect of the disclosure is the aforementioned lens, wherein the aspheric shape provides a maximum tolerance to a lateral misalignment that maintains a coupling efficiency CE between the light source and the optical fiber of $CE \geq 85\%$.

Another aspect of the disclosure is the aforementioned lens, further including the light source and the optical fiber, wherein the light source comprises a vertical-cavity surface-emitting laser.

Another aspect of the disclosure is the aforementioned lens, further including an index-matching material disposed between the end of the optical fiber and the planar rear lens surface.

Another aspect of the disclosure is the aforementioned lens, wherein the lens body is made of a resin that transmits infrared light in the wavelength range of 800 nm to 1,100 nm.

Another aspect of the disclosure is an optical system that includes a lens having a lens body with a lens axis, a front surface with an aspheric shape, and a planar rear surface, the lens body being substantially transparent to an infrared wavelength of light. The lens includes TIR surface formed in the lens body between the front and rear lens surfaces and that folds the lens axis by substantially 90 degrees. The optical system includes an optical fiber having a core and an end, with the optical fiber arranged with its end abutting the planar rear lens surface. The optical system also has a light source disposed substantially at a front focus distance away from the front lens surface, with the light source being configured to emit light having an infrared wavelength. The optical system has a back focus that resides within the optical fiber core at a back focus distance F2 from the planar rear surface.

Another aspect of the disclosure is the aforementioned optical system, wherein the back focus distance F2 is in the range of 0 microns≤F2≤500 microns.

Another aspect of the disclosure is the aforementioned optical system, wherein the back focus distance F2 is in the range of 0 microns≤F2≤200 microns.

Another aspect of the disclosure is the aforementioned optical system, wherein the front surface has a shape defined by a radius R in the range of 80 microns≤R≤300 microns.

Another aspect of the disclosure is the aforementioned optical system, wherein the optical fiber core has a parabolic gradient-index profile.

Another aspect of the disclosure is the aforementioned optical system, wherein the shape of the front lens surface provides a maximum tolerance to a lateral misalignment of the light source relative to the lens axis while maintaining a coupling efficiency CE between the light source and the optical fiber of CE≥85%.

Another aspect of the disclosure is the aforementioned optical system, wherein the light source comprises a vertical-cavity surface-emitting laser.

Another aspect of the disclosure is the aforementioned optical system, wherein the lens has an axial thickness d2 between the front and rear surfaces in the range of 400 microns≤d2≤1,600 microns.

Another aspect of the disclosure is the aforementioned optical system, further comprising the lens body being made of a resin that transmits infrared light in the wavelength range of 800 nm to 1,100 nm.

Another aspect of the disclosure is a fiber optic interface module configured to provide optical communication of infrared light between a plurality of light sources and a plurality of optical fibers each having an end and a core. The module has a module body that is substantially transparent to the infrared light and that includes a top surface and a bottom surface, wherein the top surface defines a TIR mirror, an end wall, and optical fiber support features that operably support the plurality of optical fibers, with the optical fiber ends abutting the end wall. The module has a plurality of lens surfaces formed on the bottom surface of the module body, wherein the lens surfaces, the TIR mirror, the end wall and intervening portions of the module body define a plurality of lenses each having a folded optical axis that can be laterally offset from a corresponding one of the plurality of light sources by a lateral misalignment. The lens surfaces each have a shape that provides a theoretical coupling efficiency CE≥85% between each light source and the corresponding optical fiber, the lens surfaces defining corresponding back focuses that fall within the optical fiber core of the corresponding optical fibers at respective back focus distances F2 when the optical fibers are operably supported one each in the optical fiber support features.

Another aspect of the disclosure is the aforementioned fiber optic interface module, wherein the back focus distances F2 are in the range of 0 microns≤F2≤500 microns.

It is to be understood that both the foregoing general description and the following Detailed Description represent embodiments of the disclosure, and are intended to provide an overview or framework for understanding the nature and character of the disclosure as it is claimed. The accompanying drawings are included to provide a further understanding of the disclosure, and are incorporated into and constitute part of this specification. The drawings illustrate various embodiments of the disclosure and together with the description set forth herein serve to explain the principles and operations of the disclosure. The claims are incorporated into and constitute part of the Detailed Description set forth below.

Additional features and advantages of the disclosure are set forth in the Detailed Description that follows and will be apparent to those skilled in the art from the description or recognized by practicing the disclosure as described herein, together with the claims and appended drawings.

Cartesian coordinates are shown in certain of the Figures for the sake of reference and are not intended as limiting with respect to direction or orientation.

DETAILED DESCRIPTION

The present disclosure relates to fiber optic interface modules and assemblies, and in particular to such modules and assemblies that employ total internal reflection. Example embodiments of the fiber optic interface module are first discussed, followed by example embodiments of fiber optic interface assemblies that employ the fiber optic interface module. Example configurations for the lens associated with the fiber optic interface module are then described in connection with an optical system formed by the lens, the light source and the optical fiber.

Fiber Optic Interface Module

Figure 1:
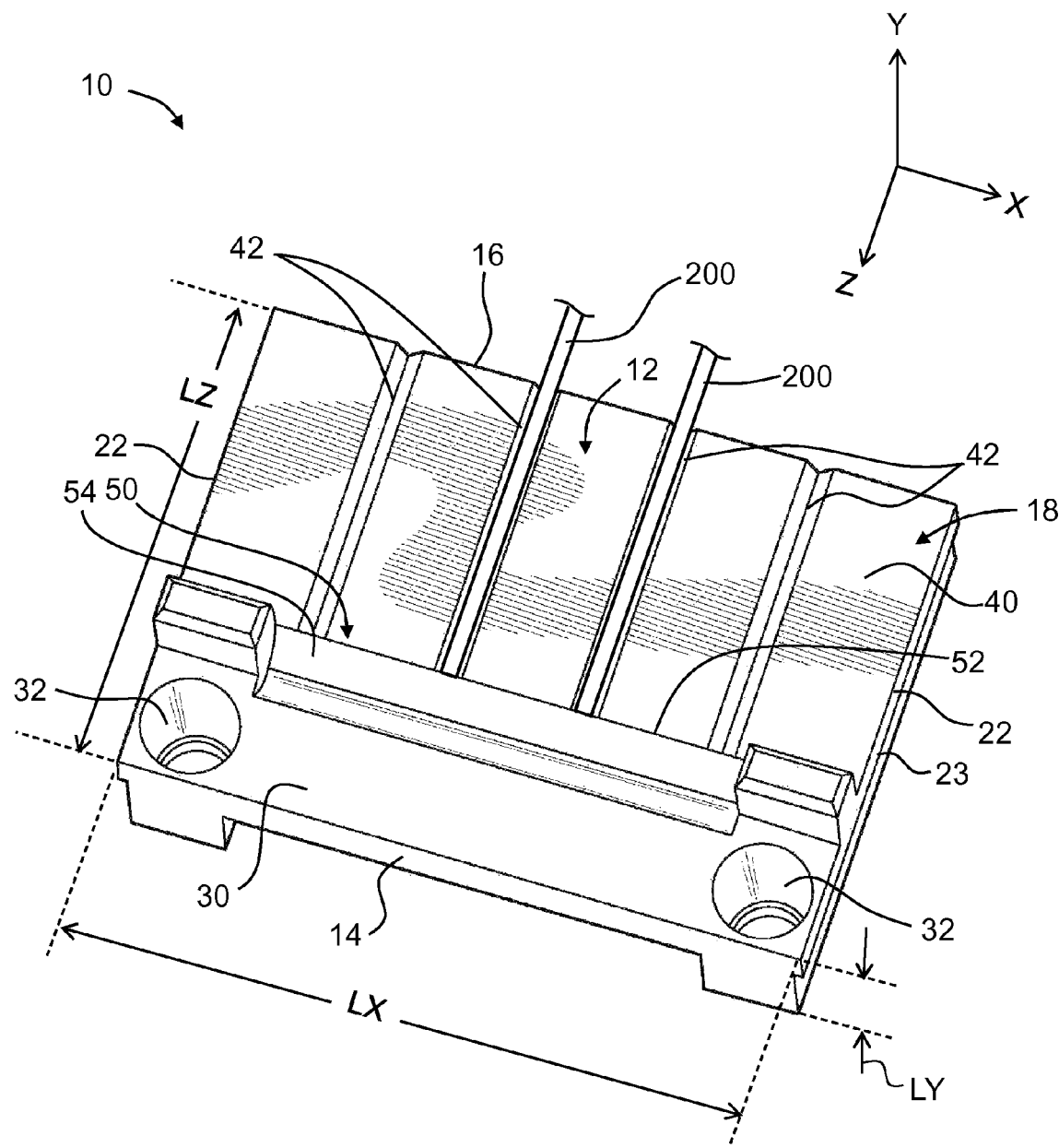
FIG. 1 is a top-down elevated view of an example fiber optic interface module according to the disclosure.
Figure 2:
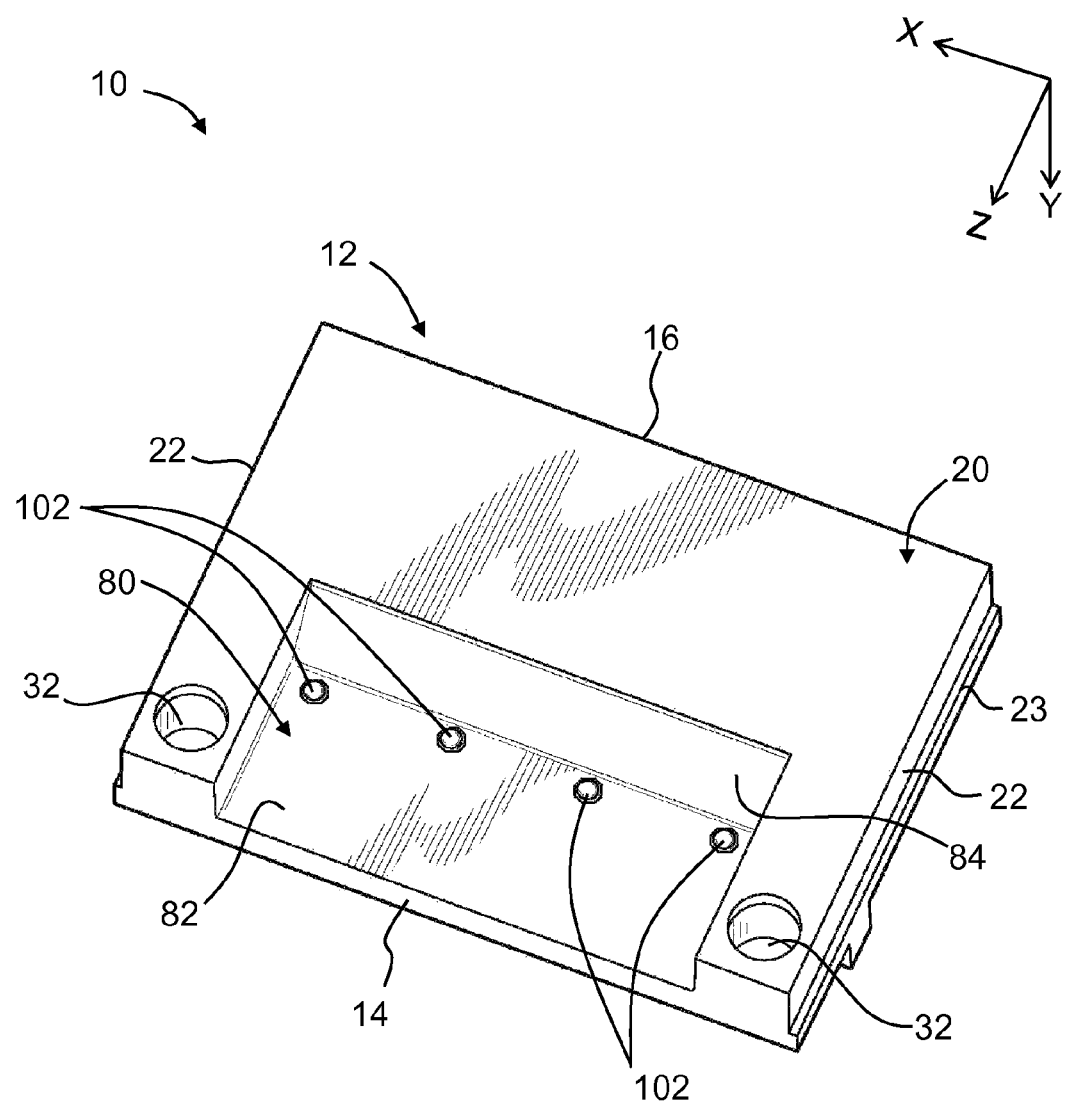
FIG. 2 is a bottom-up view of the example fiber optic interface module of FIG. 1.
Figure 3:
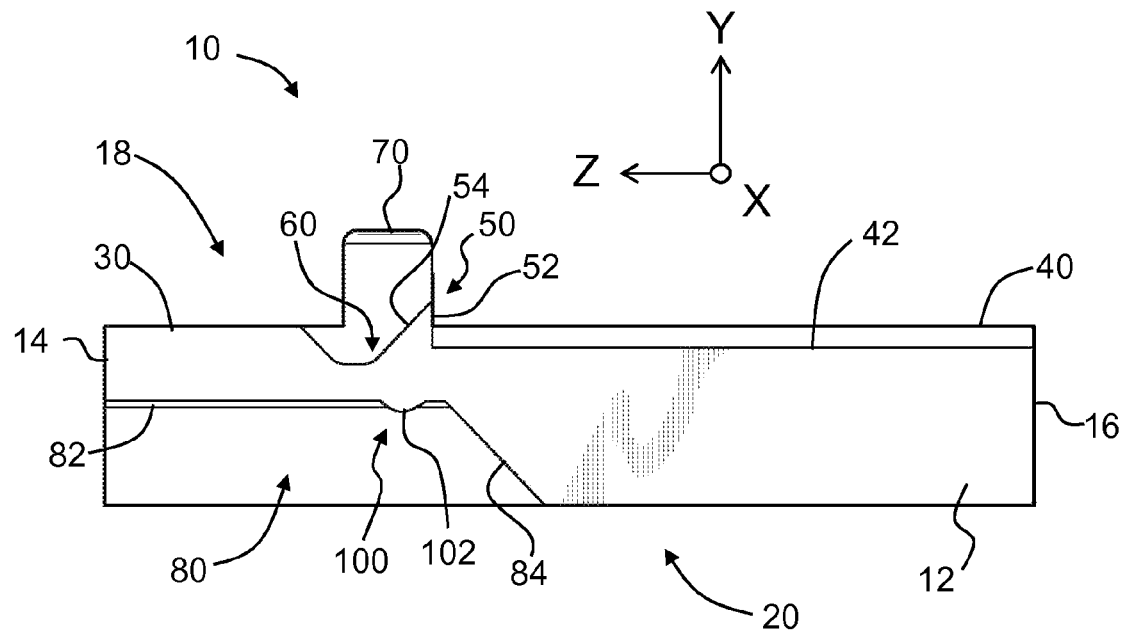
FIG. 3 is a cross-sectional view of the example fiber optic interface module of FIGS. 1 and 2 as taken in the Y-Z plane and along one of the optical fiber support features.

FIG. 1 is a top-down elevated view of an example fiber optic interface module ("module") 10 according to the disclosure. FIG. 2 is a bottom-up view of the example module 10 of FIG. 1, while FIG. 3 is a cross-sectional view of the example module 10 of FIGS. 1 and 2 as taken in the Y-Z plane along one of the optical fiber support features 42 (introduced and discussed below).

The module 10 has a body 12 that in an example that generally has a rectangular parallelepiped shape that includes additional features formed therein as described below. The body 12 has a front end 14, a rear end 16 that is substantially parallel to the front end, a top surface 18 and a bottom surface 20 that is generally parallel to the top surface. The body 12 also has generally parallel sides 22 that in an example each include a ledge 23. The module 10 has dimensions of length LZ, width LX, and height LY as shown in FIG. 1, which are typically as small as possible unless space restrictions are not an issue. Examples of these dimensions include 2 mm≤LZ≤10 mm, 2 mm≤LX≤10 mm and 1 mm≤LY≤4 mm, but other suitable shapes and/or sizes are possible using the concepts disclosed herein.

The top surface 18 includes a front top-surface section 30 that is adjacent front end 14 and that includes two alignment holes 32 that are formed adjacent respective sides 22 and that extend through to bottom surface 20 in the Y direction. The top surface 18 also includes a rear top-surface section 40 that is adjacent rear end 16 and that includes one or more optical fiber support features 42. The optical fiber support features 42 are each sized to accommodate an optical fiber 200. In an example, optical fiber support features 42 are grooves that run in the Z direction, i.e., generally parallel to sides 22. In an example, the grooves have a V-shaped cross-section.

FIG. 1 shows two optical fibers 200 respectively disposed within two of the four optical fiber support features 42. An example optical fiber 200 is a multi-mode optical fiber, such as, for example, a large-core, high-numerical-aperture optical fiber, e.g., the VSDN™ optical fiber, available from Corning Incorporated of Corning, N.Y. Example optical fibers 200 are also discussed in published PCT Patent Application Publication No. WO2010036684, entitled "High numerical aperture multimode optical fiber," which is incorporated by reference herein.

Figure 4:
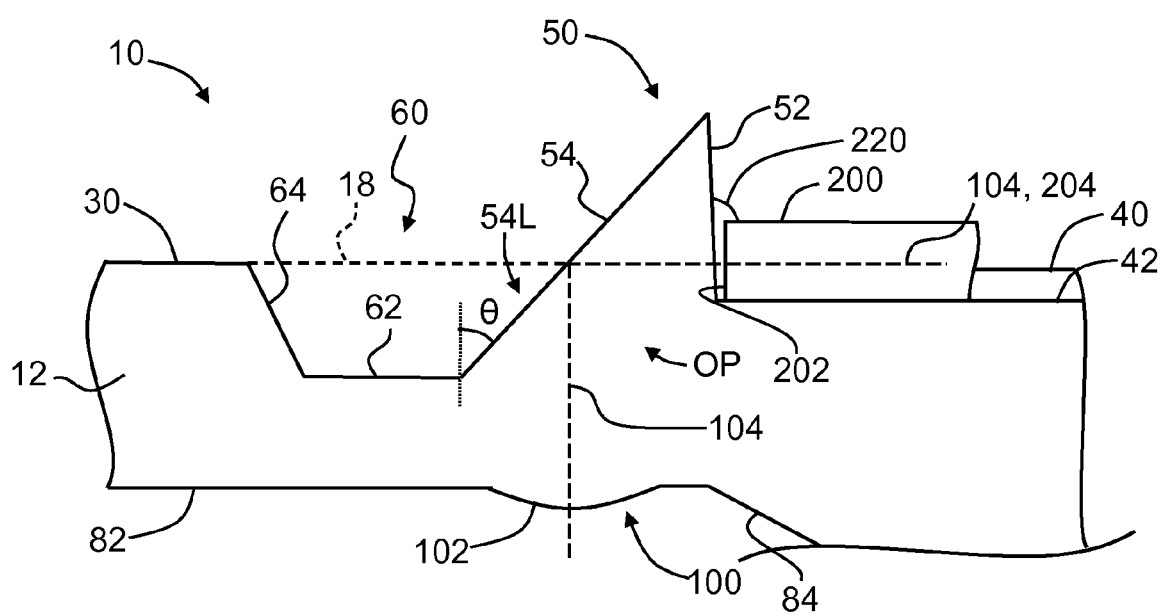
FIG. 4 is a close-up cross-sectional view of the fiber optic interface module in the region around a triangular ridge that runs across a portion of the module and whose angled wall serves as a total-internal-reflection mirror.
Figure 10:
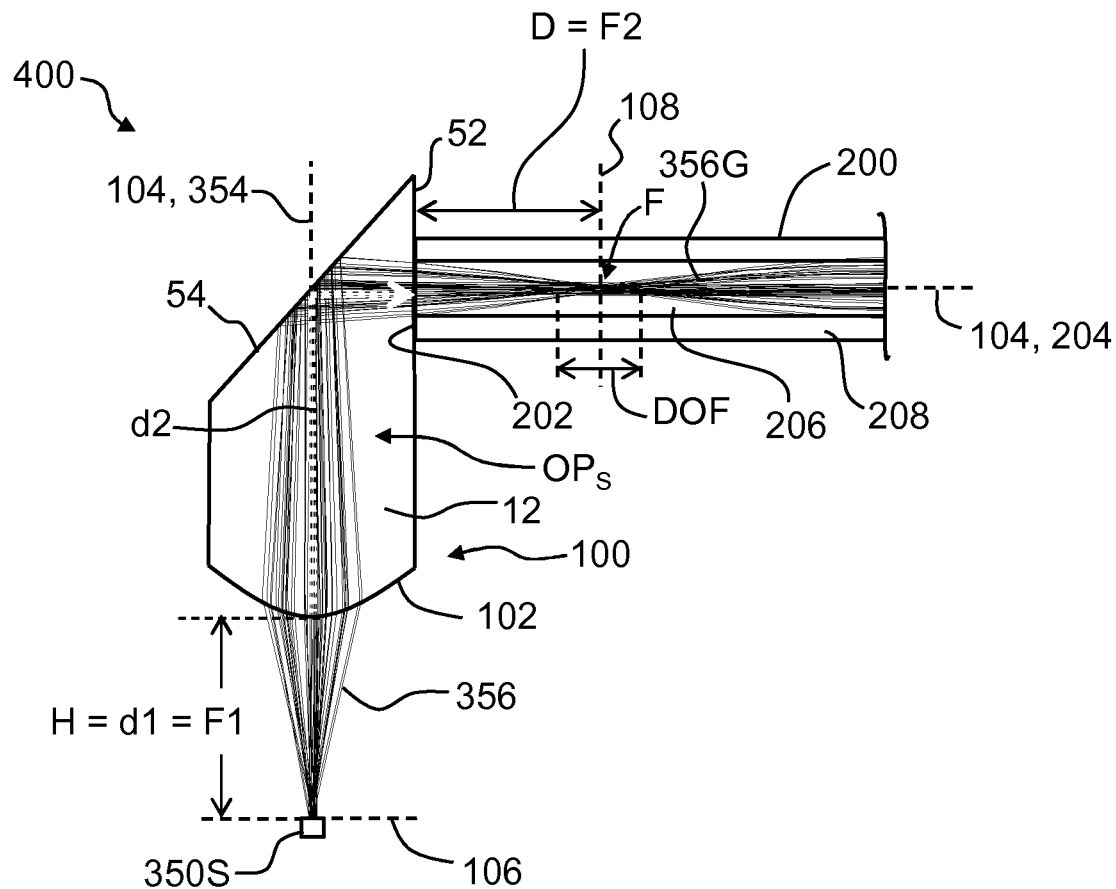
FIG. 10 is a schematic diagram of an example optical system as formed by the lens of the fiber optic interface module, and a light source and an optical fiber operably arranged relative to the lens.

The top surface 18 also includes a ridge 50 that resides between the front and rear top-surface sections 30 and 40 and that runs across the module 10, i.e., in the X direction. FIG. 4 is a close-up cross-sectional view of the region of module body 12 around ridge 50, and also shows a section of optical fiber 200 supported by optical fiber support feature 42. With reference also to FIG. 10 (introduced and discussed below), optical fiber 200 has an end 202 and a central axis 204 that coincides with the central axis of an optical fiber core ("core") 206 having an index of refraction $n_C$. The core 206 is surrounded by a cladding 208 having an index of refraction $n_{CL}$, where $n_{CL} \leq n_C$. In an example, optical fiber 200 has a numerical aperture $NA_F=0.29$. Also in an example, core 206 has a gradient-index profile, which in an example is a parabolic profile. In an example, core 206 has a diameter of about 80 microns.

In an example, ridge 50 has a generally triangular cross-sectional shape and includes a substantially vertical end wall 52 facing rear end 16 and an angled wall 54 that faces front end 14 and that slopes away from the front end at an angle relative to top surface 18. In an example, angled wall 54 has a nominal angle θ=45° relative to the Y direction. The end wall 52 terminates at optical fiber support features 42 in rear top-surface section 40 at substantially a right angle. The optical fiber support features 42 are open at rear end 16.

Also in an example, end wall 52 can depart from being purely vertical by a small amount (e.g., by 2°) to allow for an index-matching material 220 (e.g., an epoxy) to flow around end 202 of optical fiber 200 and reside between the optical fiber end and the end wall without trapping an air bubble therebetween. The end wall 52 thus serves as a mechanical stop for optical fiber end 202 that establishes the longitudinal position (i.e., the Z-directional position) of optical fiber 200 supported by optical fiber support feature 42.

In an example, angled wall 54 includes a lower portion 54L that also serves as a rear wall of a trench 60 formed adjacent ridge 50 toward front end 14 and immediately adjacent angled wall 54. The trench 60 also includes a floor 62 and a front wall 64 toward front end 14 and opposite angled wall 54. The trench 60 can also be such that floor 62 is curved so that the floor, front wall 64 and rear wall (lower portion) 54L form one continuously curved surface, with the lower portion/rear wall being linearly sloped.

The trench 60 serves to provide for a lengthier air-body interface for angled wall 54 than would be possible were the angled wall to be terminated at top surface 18 (shown in phantom for reference). This allows for angled wall 54 to serve as a substantially 90-degree total-internal-reflection (TIR) mirror whose purpose is described in greater detail below. Angled wall 54 is referred to hereinafter as TIR mirror 54. Simply stated, the TIR mirror 54 provides an interface between the material of the angled wall 54 and the air having different indices of refraction for turning the optical signal within the module 10.

The module 10 may also include optional alignment posts 70 that are formed in top surface 18 in between trench 60 and sides 22 and that extend upwardly from the top surface, i.e., in the Y direction for attaching the cover. However, other embodiments that use the cover may be design so the cover snap-fits or has a friction-fit for attachment.

As best seen in FIG. 2 and FIG. 3, module 10 includes in body 12 a recess 80 formed in bottom surface 20 and adjacent front end 14. The recess 80 defines in module body 12 a ceiling 82 and an end wall 84, the latter of which is shown as being sloped away from front end 14. The ceiling 82 includes near end wall 84 one or more lens surfaces 102. The one or more lens surfaces 102 define, along with TIR mirror 54 and end wall 52, corresponding one or more lenses 100 each having a folded lens axis 104. The folded lens axis 104 passes through lens surface 102 and end wall 52 at substantially right angles thereto.

The one or more lens surfaces 102 and the associated one or more folded lens axes 104 are aligned with the corresponding one or more optical fiber support features 42 along the Z direction, with one lens surface for each optical fiber support feature, and thus one lens surface for each optical fiber 200 supported therein.

In an example, the portion of folded lens axis 104 that runs in the Z direction coincides with the optical fiber central axis 204 when the corresponding optical fiber 200 resides in the corresponding optical fiber support feature 42. Thus, optical fiber support features 42 are configured so that optical fiber central axis 204 and lens axis 104 intersect substantially at right angles and substantially at angled wall 54. The folded lens axis 104 defines a section of a folded light-source ("source") optical path $OP_S$ or a folded photodetector ("detector") optical path $OP_D$, wherein a portion of each optical path resides within module body 12, as discussed below.

The lens surface 102, TIR mirror 54, the corresponding portion of end wall 52 and the corresponding portion of module body 12 therebetween define lens 100 having the folded optical axis 104. The lens surface 102 can be considered a "front" lens surface and end wall 52 can be considered a "rear" lens surface. The corresponding portion of module body 12 constitutes the lens body, which is also denoted 12. The axial distance between the front and rear lens surfaces 102 and 52 is the lens thickness, i.e., the thickness of the lens body 12 (see d2 in FIG. 10).

In an example, lens surfaces 102 are formed integrally on ceiling 82, i.e., are integral with module body 12 and so constitute a curved portion of module body 12. In another example, lens surfaces 102 are added to ceiling 82. The lens surfaces 102 each have a diameter or clear aperture CA. In an example, lens surfaces 102 each have a clear aperture CA of between 250 microns and 500 microns, and in a more specific example between 300 microns and 400 microns, but other suitable sizes are possible.

In an example, module body 12 is made of a material that is substantially transparent to light (i.e., light 356, introduced and discussed below) having an infrared (IR) wavelength $\lambda$, such as an IR wavelength $\lambda$ in the range of 800 nm to 1,100 nm, which is the wavelength range of VCSELs used in forming optical data links. In addition, module body 12 has a refractive index n sufficiently large to provide nominally 90° total-internal reflection (TIR) at TIR mirror.

In an example embodiment, module body 12 is formed from a transparent resin such as Polyetherimide (PEI) sold by the General Electric Company under the trademarked name ULTEM® 1010, which has a refractive index of about n=1.64 in the aforementioned IR wavelength range. In an example, module body 12 is monolithic and is formed, for example, by molding, by machining or by a combination of both molding and machining. In an example the mold is made of steel and is precision micro-machined so that the features of module body 12, including lenses 100, are formed with high precision.

Fiber Optic Interface Assembly

Figure 5:
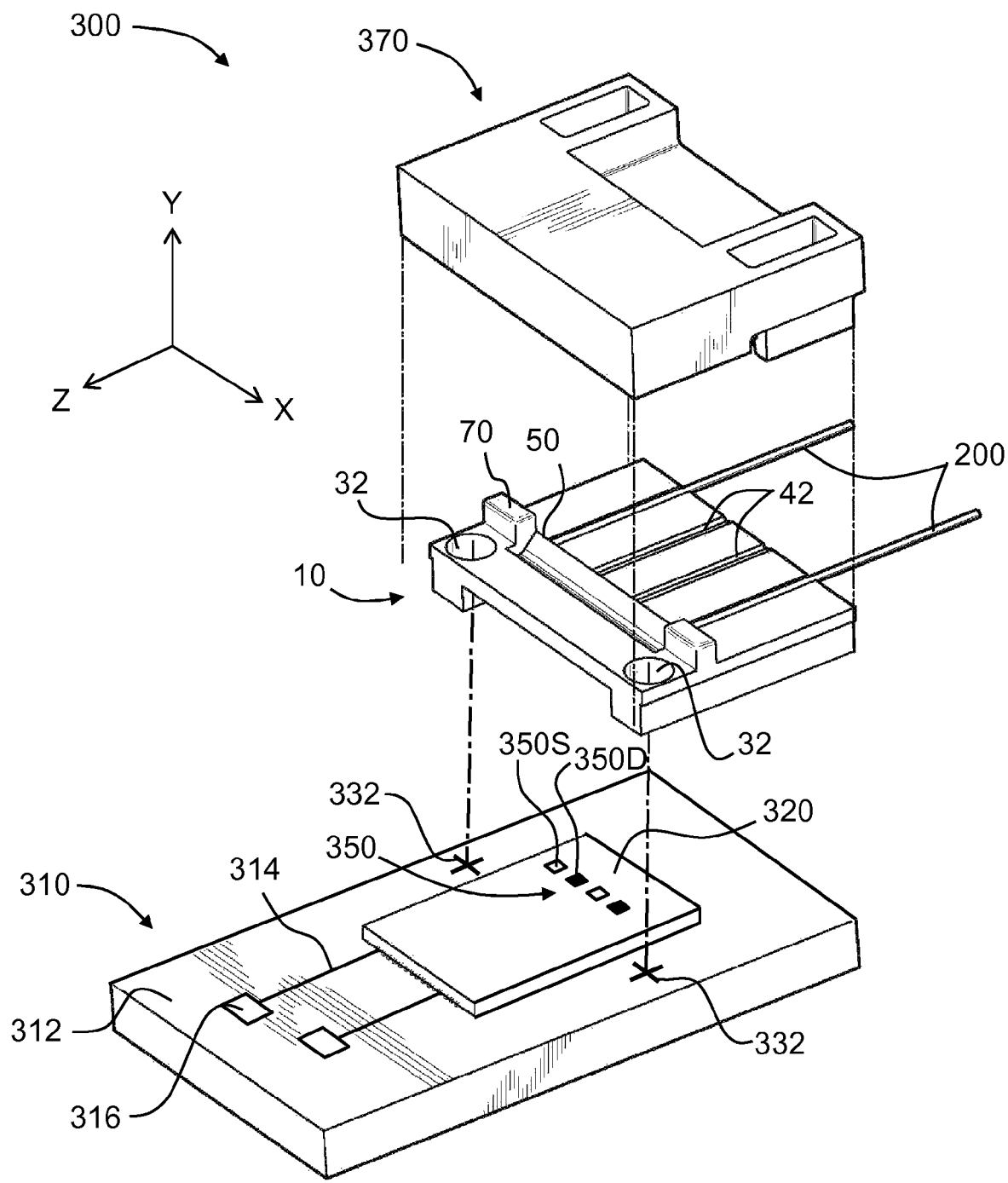
FIG. 5 is an exploded view of an example embodiment of a fiber optic interface assembly that includes the fiber optic interface module of FIGS. 1 through 4, an optional cover and a printed circuit board (PCB) that operably supports an integrated circuit (IC) chip and active photo-devices.
Figure 6:
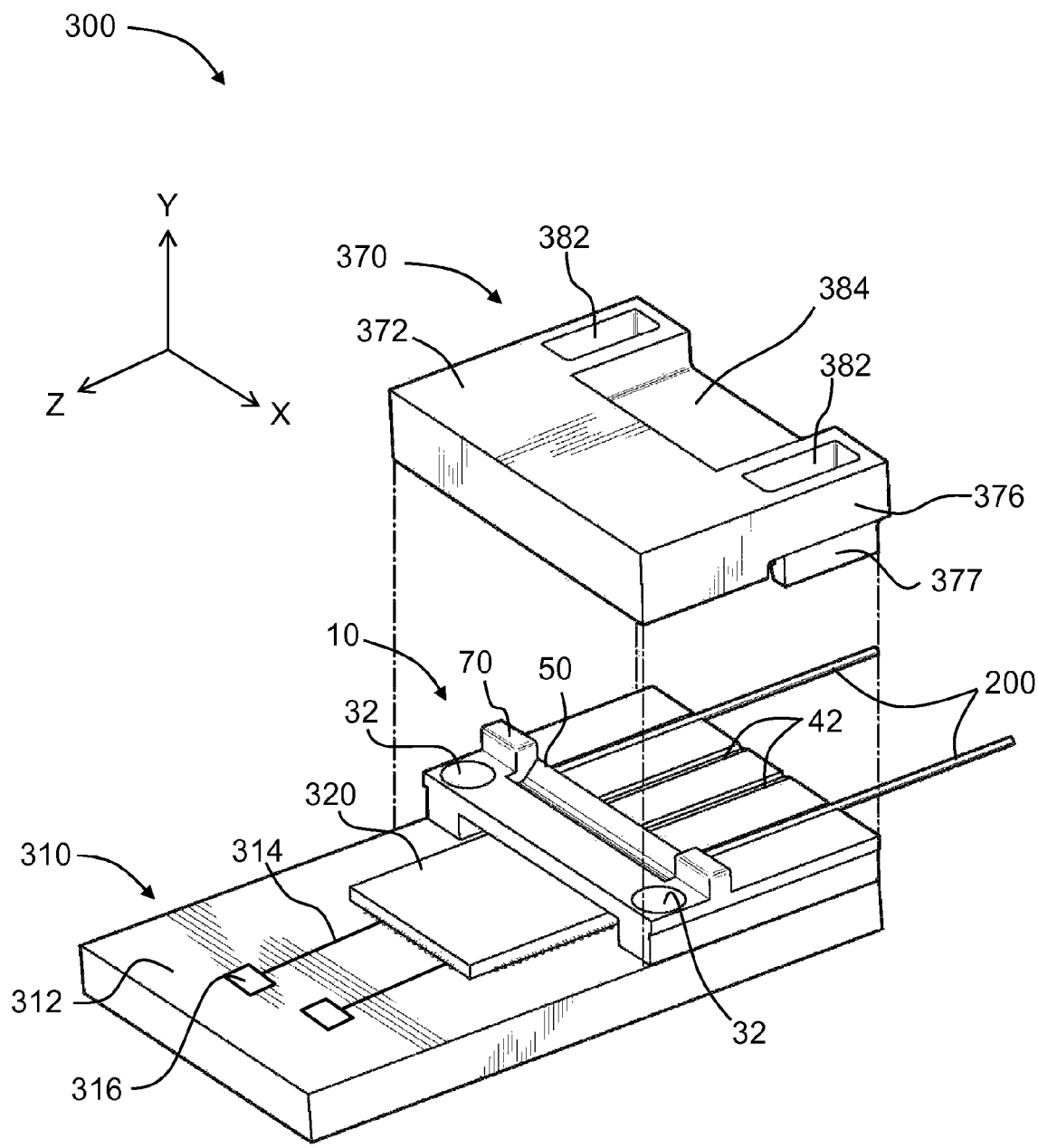
FIG. 6 is a partially exploded view similar to FIG. 5 and shows the fiber optic interface module operably disposed relative to the PCB.
Figure 7A:
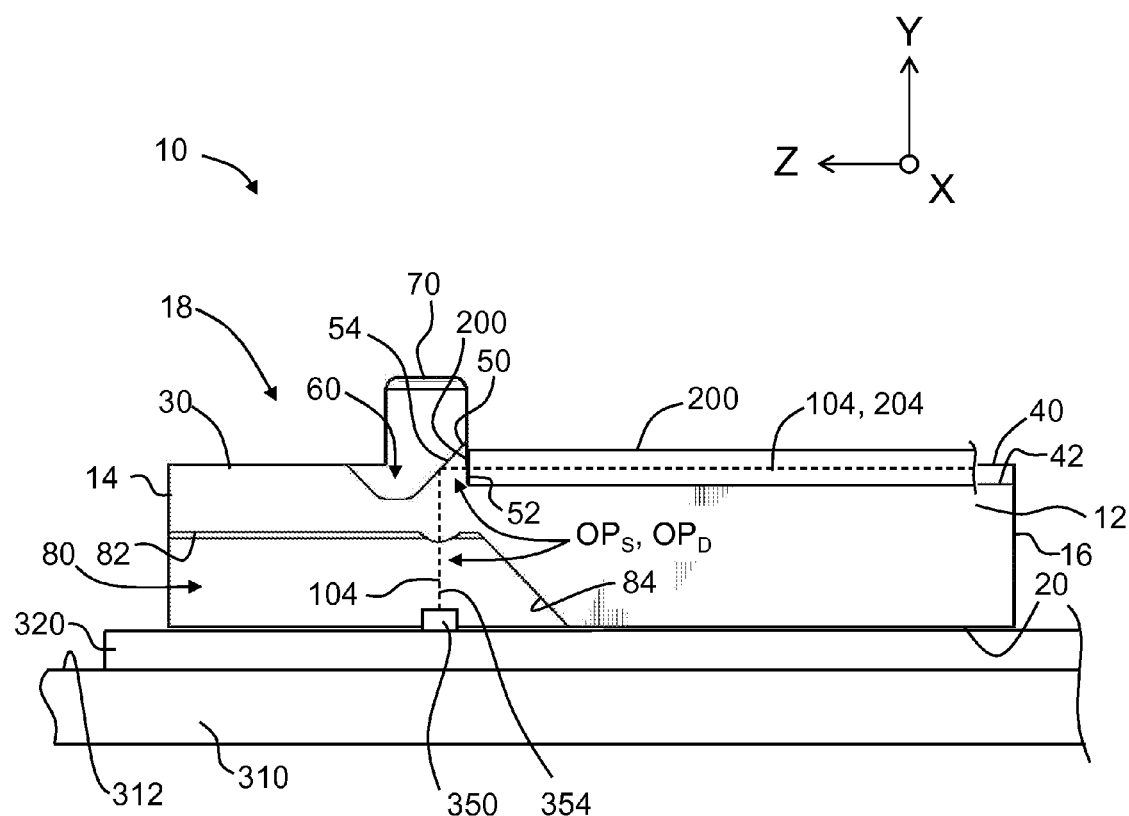
FIG. 7A is a cross-sectional view of the fiber optic interface assembly illustrating an embodiment where the active photo-device shown is operably supported atop the IC chip.
Figure 7B:
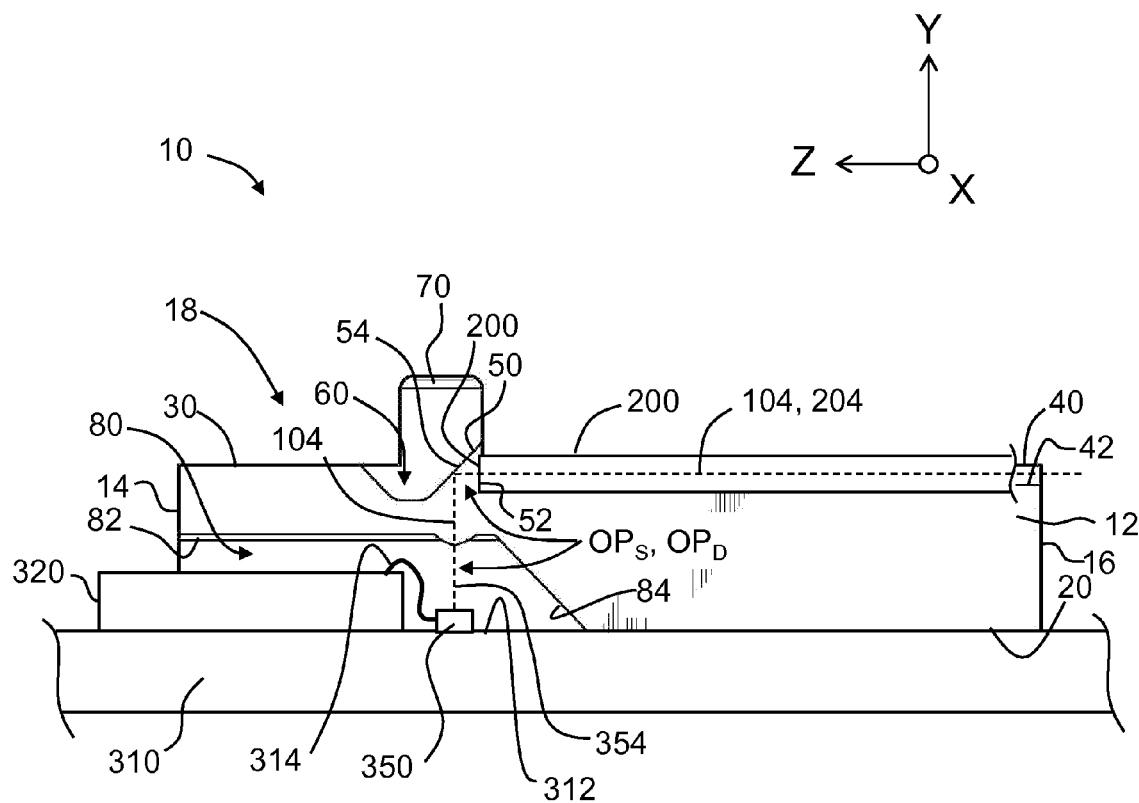
FIG. 7B is similar to FIG. 7A and illustrates an example embodiment wherein the active photo-device shown is operably supported directly on the PCB surface adjacent an IC chip that fits within the module recess and that is electrically connected to the active photo-device.

FIG. 5 is an exploded view of an example embodiment of a fiber optic interface assembly ("assembly") 300 that employs module 10. FIG. 6 is a partially exploded view similar to FIG. 5. FIGS. 7A and 7B are two example cross-sectional views of different embodiments of assembly 300. The assembly 300 may be a portion of an optical-electrical engine for a larger assembly such as a optical-electrical connector or cable assembly. The term "optical-electrical" is used to describe the connector because it performs optical-to-electrical and an electrical-to-optical conversions within the connector. In other words, the connector has electrical contacts for connectivity to a device along with active electronics inside for converting the electrical signals to optical signals and vice-versa for transmission along the optical waveguide such as an optical fiber attached to a module of the connector. Examples of transmission protocols for O-E connectors include USB, DisplayPort, Thunderbolt and the like. However, the modules disclosed herein can have other applications for O-E devices known or further developed.

The assembly 300 includes a printed circuit board (PCB) 310 having an upper surface 312 that includes metal wiring 314 (including wire bonds) and contact pads 316. The PCB upper surface 312 operably supports an active component such as an integrated circuit (IC) chip 320 or other suitable component. In this example, IC chip 320 operably supports at least one active photo-device 350, such as a light source 350S or a photodetector 350D, or both. However, in typical constructions the photo-device and/or VCSEL are discrete components secured to the PCB. The active photo-device 350 has a device axis 354. An example light source is a VCSEL. FIGS. 5, 6 and 7A show an example where two light sources 350S and two photodetectors 350D are supported atop IC chip 320. When active photo-device 350 comprises light source 350S, device axis 354 is referred to as a light-source axis. When active photo-device comprises photodetector 350D, device axis 354 is referred to as a photodetector axis.

In an example, light source 350S has a numerical aperture $NA_S$ associated with the mission of light 356 that is equal to or less than the optical fiber numerical aperture $NA_F$. In an example, $NA_S=0.26$ and other suitable values for $NA_S$ are possible. Likewise, in an example, photodetector 350D has a numerical aperture $NA_D$ that is larger than the optical fiber numerical aperture $NA_F$.

FIG. 7B shows an alternate example where one or more active photo-devices 350 are operably supported directly on PCB upper surface 312 adjacent IC chip 320. The IC chip 320 is shown electrically connected to active photo-device 350 via wire bonds 314 on PCB surface 312. In an example embodiment, IC chip 320 serves as a light-source driver (e.g., a VCSEL driver), a photodetector signal processor (e.g., a transimpedance amplifier), or both.

Note in FIG. 7B how recess 80 provides space for IC chip 320 and active photo-devices 350, while also providing an adequate stand-off between active photo-devices 350 and their corresponding lenses 100. In an example, recess 80 defines a stand-off height H (see FIG. 9A introduced and discussed below) from active photo-device 350 (shown as light source 350S) that is about the same as a front focus distance F1 of lens 100 on the IC chip 320 side of module 10. The stand-off height H allows for active photo-device 350 and lens surface 102 to be properly spaced apart so that the active photo-device and lens 100 are cooperatively arranged relative to one another.

The lens 100 also has a back focus distance F2 as measured from end wall 52 of ridge 50, wherein F2 is equal to or greater than 0 (i.e. F2≥0), and wherein the limit as F2 gets very large represents substantially collimated light. It is noted here that the term "back focus distance" refers herein to the case where the "object" in the form of active photo-device 350 (namely, light source 350S) is not at infinity but rather is located at a "front focus distance" from lens surface 102. Further details about example embodiments of lens 100 are provided below. Thus, focus distance F2 is such that a focus F resides at or beyond end wall 52.

The PCB 310 also includes fiducials 332 that are aligned with and configured to fit into alignment holes 32 of module 10, but other alignment features are possible. Fiducials 332 can have a variety of forms and shapes that facilitate alignment and are shown as crosses by way of example. The alignment holes 32 and fiducials 332 serve as passive alignment features that are cooperatively configured to provide for passive alignment between module 10 and IC chip 320, and in particular to provide for passive alignment between each lens 100 and the corresponding active photo-device 350 when module 10 is interfaced with PCB 310. In an example, module 10 can be fixed in place on PCB upper surface 312 using a fixing agent such as epoxy. In an example, a vision system (e.g., a machine vision system) can be used to establish the passive alignment of module 10 and PCB 310 by viewing fiducials 332 through alignment holes 32 and aligning them therewith prior to these components being interfaced, such as illustrated in the exploded view of FIG. 5.

Figure 8:
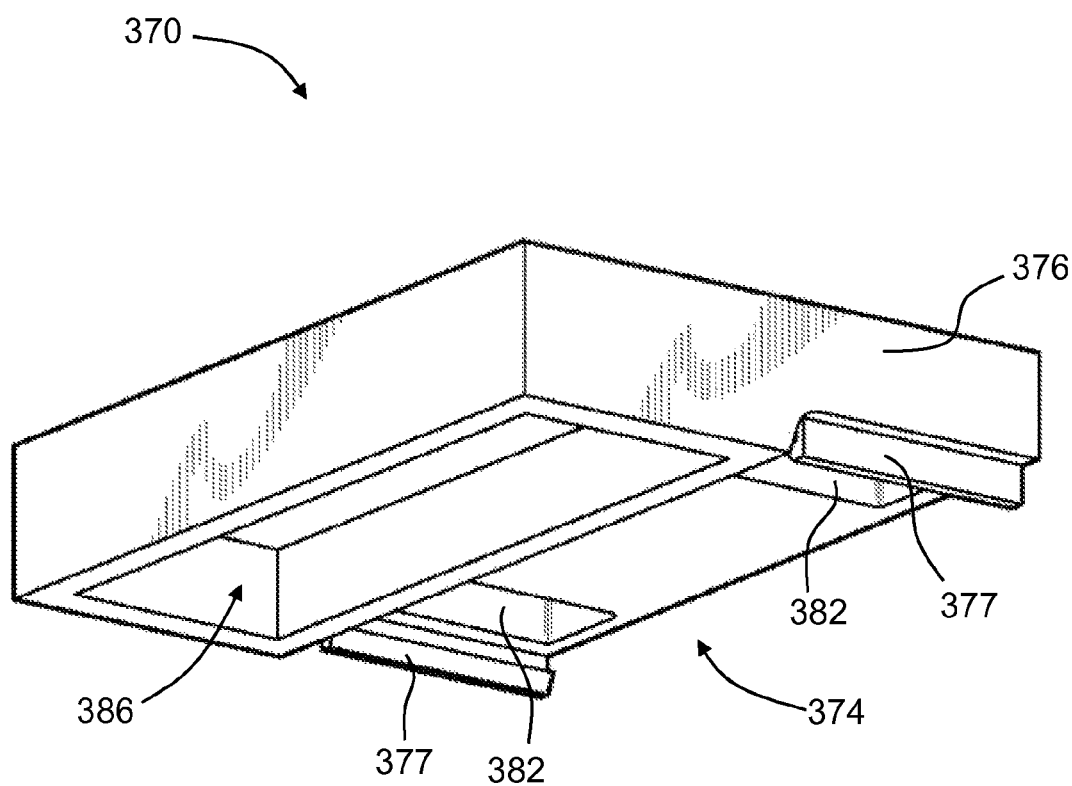
FIG. 8 is a bottom-up view of an example embodiment of the optional cover for the fiber optic interface module.

FIG. 8 is a bottom-up view of an example cover 370 configured to mate with and cover top surface 18 of module body 12. With reference to FIG. 6 and FIG. 8, cover 370 has a top surface 372, a bottom surface 374 and sides 376. The cover 370 is configured to fit over and be secured to module 10 to prevent contaminants such as dust, dirt, etc. from depositing onto the module. In particular, cover 370 serves to prevent TIR mirror 54 from coming into contact with contaminants, which can act to reduce the TIR effect. In an example, cover 370 is configured to press optical fibers 200 down into optical fiber support features 42 to keep them aligned during the assembly process in which, in one example, a curable epoxy is used to hold the optical fibers in place.

The top surface 372 of an optional cover 370 including holes 382 and a recess 384 that serve to enhance the fit of the cover to module 10 and that can also be used for handling the cover. The bottom surface 374 includes a large recess 386 configured to accommodate alignment posts 70 that extend upward from top surface 18 of module 10 and that assist in aligning the cover with the module. The sides 376 optionally include downwardly depending flange members 377 that are configured to matingly engage respective ledges 23 of module 10 at sides 22. In an example, flange members 277 and ledges 23 are configured to snap engage so that cover 370 can be snap fit onto (i.e., snap-mated with) module 10.

In an example, cover 370 is made of a molded material such as Ultem, though the cover need not be transparent to IR wavelengths of light. Example materials for cover 370 include polycarbonate and other types of plastics. Of course, other variations of the cover, materials or the like are possible according to the concepts disclosed.

Figure 9A:
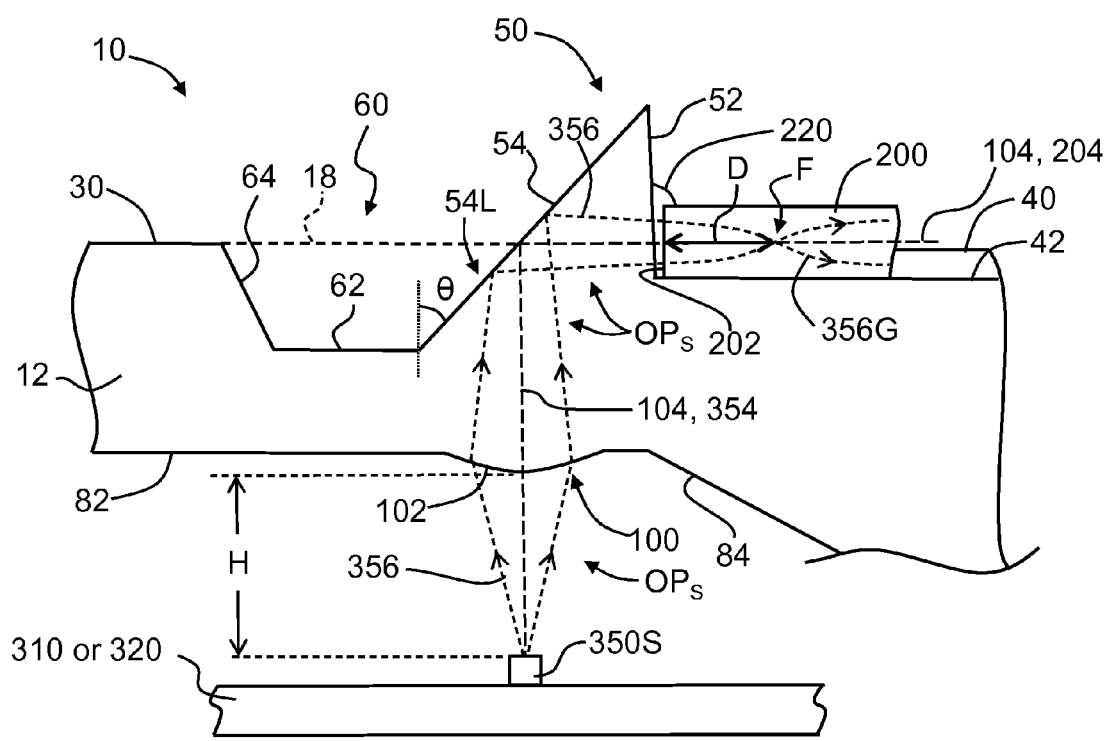
FIG. 9A is a close-up view similar to FIG. 4 and shows the PCB or the IC chip and the active photo-device as a light source, and also shows the light from the light source traveling over the folded source optical path through the fiber optic interface module to a focus that resides within the optical fiber supported in the optical fiber support feature.

FIG. 9A is similar to FIG. 4 and further shows active photo-device 350 in the form of light source 350S residing atop either IC chip 320 or PCB board 310. In examples, light source 350S resides atop IC chip 320 (FIG. 7A) or adjacent IC chip 320 and on PCB upper surface 312 (FIG. 7B). In the configuration shown in FIG. 9A, light source 350S generates divergent light 356 that travels generally along lens axis 104 toward lens 100 over a source optical path $OP_S$. The divergent light 356 is incident upon convex lens surface 102, which serves to convert the divergent light into convergent light 356, which then travels within module body 12 along source optical path $OP_S$. The convergent light 356 is ultimately incident upon TIR mirror 54, which reflects this light by substantially 90° so that the light now travels toward end wall 52 of ridge 50 along source optical path $OP_S$ toward optical fiber 200. The convergent light 356 travels through end wall 52 and enters optical fiber end 202, where this light continues to travel within optical fiber 200 as guided light 356G. The guided light 356G follows a curved path by virtue of the gradient-index core 206 and comes to focus F within the core at a distance D from optical fiber end 202. Note that light 356 may pass through a thin portion of index-matching material 220 if such material is disposed between optical fiber end 202 and end wall 52.

In an example embodiment similar to that shown in FIG. 9A, lens surface 102 forms substantially collimated light that reflects from TIR mirror 54 at substantially 90° and exits end wall 52 as substantially collimated light. This embodiment can be used, for example, in certain cases where optical fiber 200 has gradient-index core 206 and light 356 is preferably introduced into the core as substantially collimated light. Note that a such a gradient-index optical fiber will bring light 356 to focus F at some distance D from optical fiber end 202, as in the case shown in FIG. 9A. Note that in an example when optical fiber end 202 resides against end wall 52, D=F2.

FIG. 9A illustrates an example embodiment where active photo-device 350 in the form of light source 350S is operably arranged at front focus distance F1 from lens surface 102 so that the light source is in optical communication with optical fiber 200 over folded source optical path OP$_S$. Generally speaking, assembly 300 supports one or more such folded source optical paths OP$_S$.

Figure 9B:
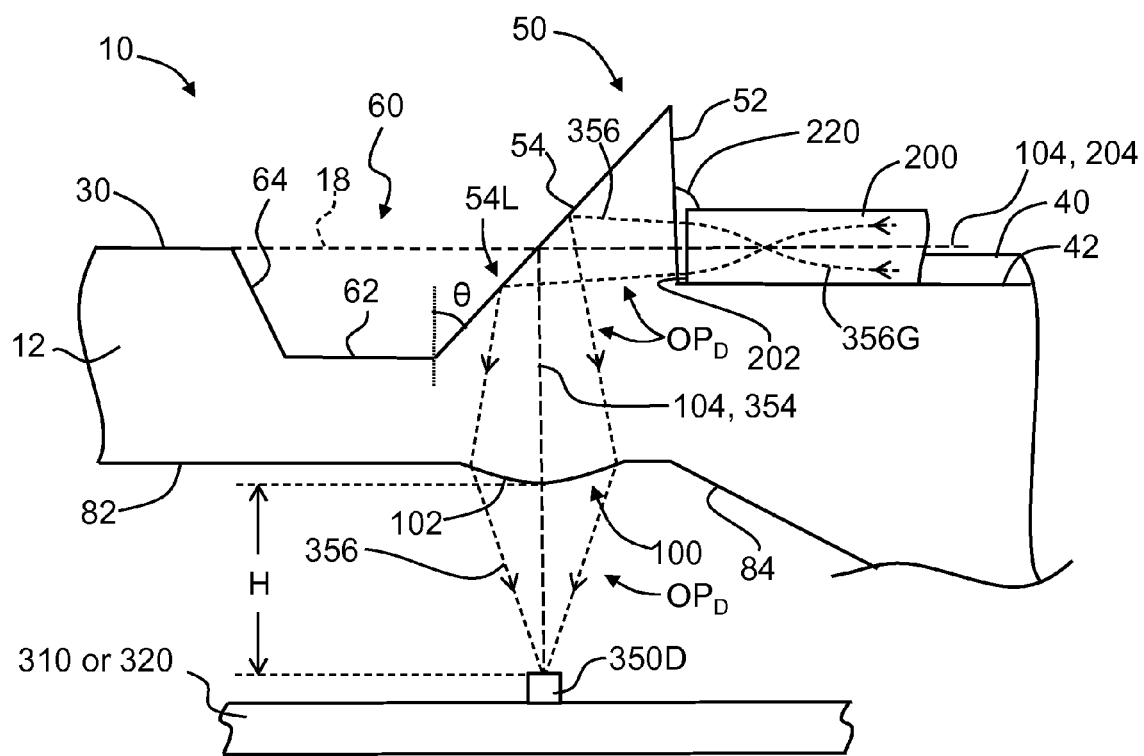
FIG. 9B is similar to FIG. 9A, and shows the light traveling in the optical fiber in the opposite direction, over a folded detector optical path from the optical fiber and through the fiber optic interface module to the active photo-device in the form of a photodetector supported by the IC chip or the PCB board.

FIG. 9B is similar to FIG. 9A and shows an example where IC chip 320 or PCB 310 operably supports photodetector 350D. In an example, photodetector 350D resides atop IC chip 320 (FIG. 7A) or adjacent IC chip 320 and on PCB upper surface 312 (FIG. 7B). In the configuration shown in FIG. 9B, guided light 356G travels in optical fiber 200 in core 206 toward optical fiber end 202 as guided light 356G from a remote light source (not shown) that is optically coupled to a remote end of the optical fiber. The guided light 356G follows a curved path due to the gradient-index core 206 and exits optical fiber end 202 as divergent light 356. This divergent light passes through end wall 52 of ridge 50 and into body 12 of module 10 as it travels over a detector optical path OP$_D$. Note that light 356 may pass through a thin portion of index-matching material 220 if such material is disposed between optical fiber end 202 and end wall 52.

The divergent light 356 is then incident upon TIR mirror 54 and reflects therefrom by substantially 90° to travel along lens axis 104 over detector optical path OP$_D$. The divergent light 356 continues diverging as it travels within module body 12 to lens surface 102. The lens surface 102 serves to convert divergent light 356 into convergent light 356 as it exits module body 12 and travels toward photodetector 350D. The convergent light 356 is generally focused down onto photodetector 350D. The photodetector 350D then receives this focused light 356 and converts it into an electrical signal (not shown) such as a photocurrent that enters IC chip 320 to be processed therein or directed elsewhere for processing.

FIG. 9B illustrates an example embodiment where active photo-device 350 in the form of photodetector 350D is operably arranged at front focus distance F1 from lens surface 102 so that it is in optical communication with optical fiber 200 over folded detector optical path OP$_D$. Generally, assembly 300 supports one or more such folded detector optical paths OP$_D$.

Note that FIG. 9A and FIG. 9B in an example describe two different portions of the same assembly 300, i.e., an assembly that includes one or more light sources 350S and also one or more photodetectors 350D and their corresponding folded optical paths OP$_S$ and OP$_D$, respectively.

It is also noted here that while lenses 100 can be the same, the (at least one) source optical path OP$_S$ and the (at least one) detector optical path OP$_D$ are typically are not identical. This is because light 356 leaving optical fiber end 202 will typically have a different divergence (numerical aperture) than light source 350S. Also, the effective location of the "light source" formed by optical fiber 200 will typically not be the same as the location of focus F of FIG. 9A. Said differently, source and detector optical paths OP$_S$ and OP$_D$ are typically not reverse optical paths. In an example, lenses 100 are the same and optimized for source optical path OP$_S$ even though they are also used for detector optical paths OP$_D$. In another example, lenses 100 are the same and are configured to provide the best compromise between efficiently communicating light 356 over source and detector optical paths OP$_S$ and OP$_D$.

An advantage of assembly 300 is that it can include a single solid-air interface at lens surface 102. In particular, an example assembly 300 includes a single surface that has optical power, namely lens surface 102. This has the advantage of reducing Fresnel reflections and reducing the opportunity for contaminants to enter the source optical path OP$_S$ or the detector optical path OP$_D$ and diminish the optical performance of assembly 300. It also simplifies the fabrication of assembly 300. Thus, in an example, source and detector optical paths OP$_S$ and OP$_D$ each include a single optical interface that has optical power, namely a corresponding lens surface 102.

Another advantage of assembly 300 is that it provides passive alignment between one or more active photo-devices 350 and the corresponding one or more optical fibers 200, i.e., one or more aligned source optical paths OP$_S$ and detector optical paths OP$_D$ between the one or more active photo-devices and the corresponding one or more optical fibers. This is accomplished via one or more passive alignment features shown by way of example in the form of alignment holes 32 in module 10 and fiducials 332 on PCB 310. This passive alignment system obviates the need to employ more expensive and complex active alignment schemes and minimizes cost and time in manufacturing assembly 300.

Another advantage of assembly 300 includes a substantially right-angled turning of the light signal at TIR mirror 54 so that a portion of the at least one source optical path OP$_S$ and a portion of the at least one detector optical path OP$_D$ lie parallel to PCB upper surface 312, on which is mounted IC chip 320 and other electronics. Another advantage is that having one lens 100 for each optical fiber 200 reduces the complexity and cost of assembly 300. Yet another advantage is that the distance between adjacent optical fibers 200 can be kept small (unlike in beam expander designs), so that assembly 300 can be configured for use with optical fiber ribbons. Another advantage of assembly 300 is that recess 80 allows for IC chips 320 to be positioned very close to active photo-devices 350, thereby enabling optimum electrical performance. Yet another advantage of assembly 300 is that it can have a compact form factor that allows it to fit in the limited space available inside most common cable connectors, thereby enabling optical-electric al (O-E) connectors, such as USB 3.0, HDMI, Display Port O-E connectors.

Example Optical System

FIG. 10 is a schematic diagram of an optical system 400 that includes lens 100 as formed as part of body 12 of module 10. The lens 100 includes an object plane 106 and a focus plane 108. The focus plane 108 is defined by the location at which light 356 is brought to its tightest focus F. Usually associated with focus plane 108 and focus F is a depth of focus DOF over which light 356 remains sufficiently concentrated. In an example, focus plane 108 is the defined as the location of the circle of least confusion. The optical system 400 also includes by way of example light source 350S located at object plane 106. The end wall 52 defines a rear lens surface for lens 100, while lens surface 102 defines a front lens surface. As mentioned above, optical fiber core 206 may have a gradient-index profile, in which case it constitutes a second lens element in optical system 400.

In an example, lens 100 is configured to be substantially optimized to relay light 356 from light source 350S and couple light 356 into optical fiber 200 over source optical path OP$_S$, as described above in connection with FIG. 9A. As discussed above, in an example the same type of lens 100 can be used to relay light 356 carried by optical fiber 200 (and emitted at optical fiber end 202) to photodetector 350D over detector optical path OP$_D$. In this case, lens 100 is generally not optimized for detector optical path OP$_D$. However, such optimization may not be required and may not have a substantial impact on the performance of assembly 300. However, in an example embodiment, the optical design of lens 100 for source optical path OP$_S$ can be adjusted (e.g., tuned away from being optimum for source optical path $OP_S$) to improve the quality of the imaging for detector optical path $OP_D$.

Figure 11:
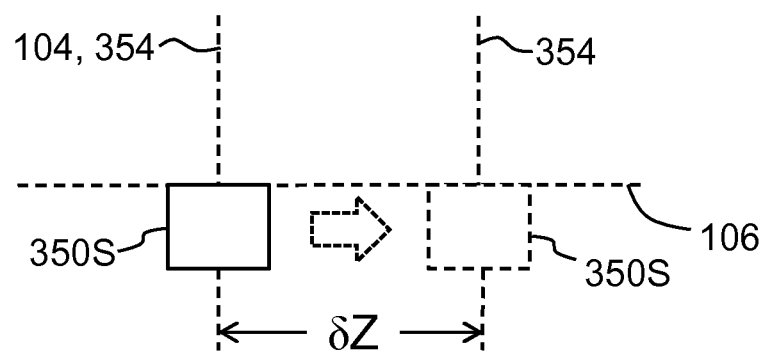
FIG. 11 is a close-up view of the light source showing an example lateral misalignment of δZ.

The conventional wisdom regarding optically coupling a light source to an optical fiber is to focus light onto the optical fiber end. Using this approach, it is possible, at least in theory, to achieve 100% coupling efficiency CE, neglecting Fresnel losses at the lens/air interface. However, such an approach does not offer the most tolerance to a lateral misalignment between light source 350S and lens axis 104. The coupling efficiency CE is defined as the percentage of light 356 coupled onto optical fiber 200 as compared to the total amount of light 356 that is available for coupling into the optical fiber. FIG. 11 is a close-up view of light source 350S showing an amount δZ of lateral misalignment (hereinafter, lateral misalignment δZ) between light-source axis 354 and lens axis 104.

Unlike the conventional wisdom, the concepts disclosed herein are advantageous since they allow the module to tolerate for lateral misalignment. To make assembly 300 tolerant to lateral misalignment, in an example lens 100 focuses light 356 within optical fiber 200 (and in particular within optical fiber core 206) at some distance D from optical fiber end 202. This configuration can still provide a coupling efficiency CE=100% (again, neglecting Fresnel reflections). Loosening the misalignment tolerances on the position of active photo-device 350 relative to lens 100 improves the performance of assembly 300 and reduces the time and cost of putting together the assembly. It also increases the manufacturing yield when manufacturing assemblies 300. An aspect of the disclosure includes a configuration for lens surface 102 that provides lens 100 with an enhanced tolerance to lateral misalignment δZ, and in an example optimizes this tolerance while maintaining a theoretical coupling efficiency CE between light source 350S and optical fiber 200 at 100%, or alternatively, at greater than some threshold coupling efficiency, e.g., CE≥90% or CE≥85%

Example Lens Design

In general, there are two parameters that define the shape of lens surface 102: its radius of curvature R and the conic constant k. The shape of lens surface 102 is then given by the equation:

$$h(r) = \frac{cr^2}{1 + \sqrt{1 - (1+k)c^2 r^2}},$$

where c=1/R is the curvature and r is the radial position. The conic constant k specifies the nature of the shape of lens surface 102: if k=0, the lens surface is spherical; if k is between 0 and −1, the lens surface is elliptical; if k=−1, the lens surface is parabolic; and if k is less than −1, the lens surface is a hyperbolic.

Figure 12:
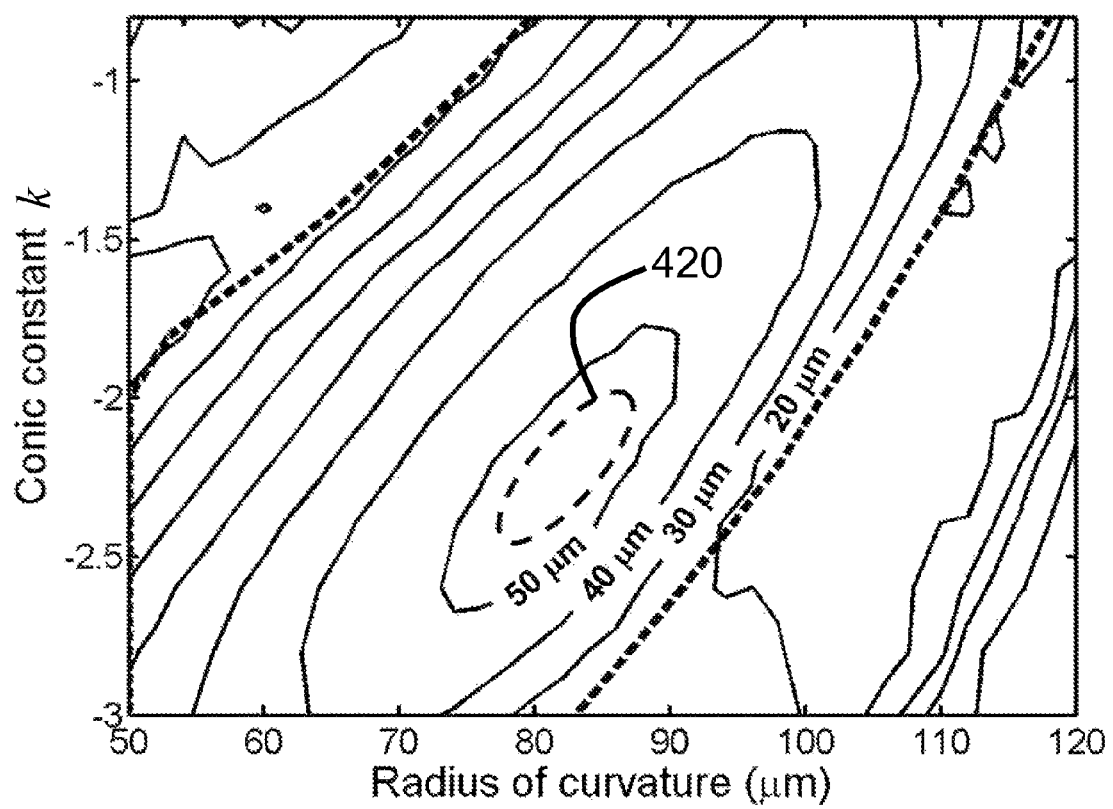
FIG. 12 is a contour plot for the radius of curvature R and the conic constant k with contours of the lateral misalignment δZ, showing the region of (R, k) space that provides the best alignment tolerance while having a coupling efficiency CE=100%.

There is a wide range of lens parameters that allows for CE to be (theoretically) 100% and an even wider range of parameters that allows for CE≤90%, and even a wider range of parameters that allows for CE≥85%. However, it turns out that some combinations of parameters achieve better misalignment tolerances than others. FIG. 12 plots for each pair of (R, k) the misalignment tolerance associated with laterally displacing light source 350S and recording the range for CE≤90%. The contours represent the tolerance on the lateral misalignment δZ for maintaining CE≤90%. The plot of FIG. 12 includes a region 420 of (R, k) space that offers the greatest misalignment tolerance. At its peak, the lateral misalignment δZ reaches a full range of 52 microns, or a half-range of ±26 microns.

Example parameters for lens 100 that correspond to this optimum region 420 of (R, k) space are provided in Table 1 below. With reference to FIG. 10, d1 is the distance from light source 350S to lens surface 102 along lens axis 104, and d2 is the (folded) axial distance from front lens surface 102 to rear lens surface (end wall) 52 (white dotted line) and thus represents the lens axial thickness. In an example, the lens axial thickness d2 is in the range of 400 μm≤d2≤1,600 μm.

The parameter D is the aforementioned distance from rear lens surface 52 to focus plane 108 and in an example is the same as the back focus distance F2. The parameter R' is the radius of curvature of rear lens surface 52, CA is the clear aperture (diameter) of lens 100, F1 is the front focus distance, and F2 is the rear focus distance. The light source 350S was modeled as a VCSEL, and optical fiber 200 was assumed to have a parabolic gradient-index core 206.

TABLE 1

Example Lens Parameters

| Parameter | Value |
| --- | --- |
| F1 = d1 | 350 microns |
| d2 | 800 microns |
| F2 = D | 100 microns |
| R | 125 microns |
| R' | ∞ (planar) |
| k | −2.0 |
| n, λ | 1.64 @ 850 nm |
| CA | 500 microns |

Note that a conic constant of k=−2.0 makes lens surface 102 aspheric, and in particular hyperbolic. Also, the value of D=100 microns places focus plane 108 well inside of optical fiber 200. In the case where optical fiber core 206 has a gradient-index profile, the optical fiber core acts as a lens and needs to be accounted for in the optical design of optical system 400 and in particular lens surface 102.

Note that the example lens parameters set forth in Table 1 represent one example of a well-optimized design. Equally good optical performance can be obtained by scaling the dimensions up or down, in which case the values of F1, d, F2, R and k need to be adjusted properly.

Figure 13:
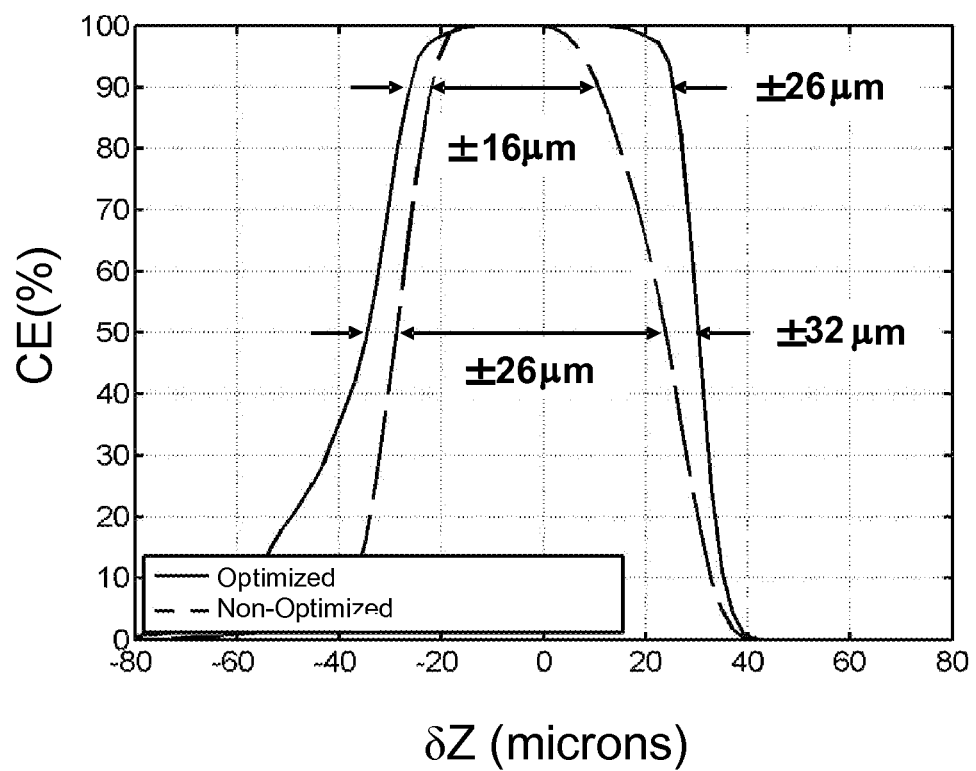
FIG. 13 is a plot of the amount of lateral misalignment δZ (microns) versus the coupling efficiency CE (%) for a conventional configuration and a configuration of the lens of the fiber optic interface module when focused within the fiber.

FIG. 13 is a comparison plot showing the effect of a back focus plane that locates the focus within the optical fiber or other optical waveguide. Specifically, FIG. 13 plots the lateral misalignment δZ (microns) versus the coupling efficiency CE (%) for a conventional configuration of lens 100 (dashed-line curve), where focus plane 108 is located at optical fiber end 202, and for an improved configuration (solid-line curve) when the focus plane is inside the optical fiber. At CE=90% (−0.46 dB), the optimized configuration of lens 100 shows an increase in the tolerance on the lateral misalignment δZ from ±16 microns to ±26 microns, which represents a 62% improvement over the non-optimized configuration. At CE=50% (−3 dB), the tolerance on lateral misalignment δZ is increased from ±26 microns to ±32 microns, which represents a 23% improvement.

The distance d1 (which corresponds roughly to stand-off H and front focus distance F1) was selected to be 200 microns in the example to accommodate wire bonds 314 and to provide for a reasonable clear aperture CA (lens diameter) based on the divergence of light 356 from a VCSEL light source 350S. The distance D2 was selected to be 400 microns because it provides for good misalignment tolerance, supports a lens design with a coupling efficiency CE=100% when there is no misalignment, and is consistent with the fabrication constraints and the desired small form factor (i.e., small dimensions LX, LY and LZ, examples of which are discussed above) for an injection-molded part. It will be understood by one skilled in the art that other values for one or more of the lens parameters can be employed to account for different configurations for module 10, different types of light sources 350S, a different material for the module, etc., depending on the specific application of assembly 300.

Window Unit for Air Interface at the Lens Surface

Figure 14:
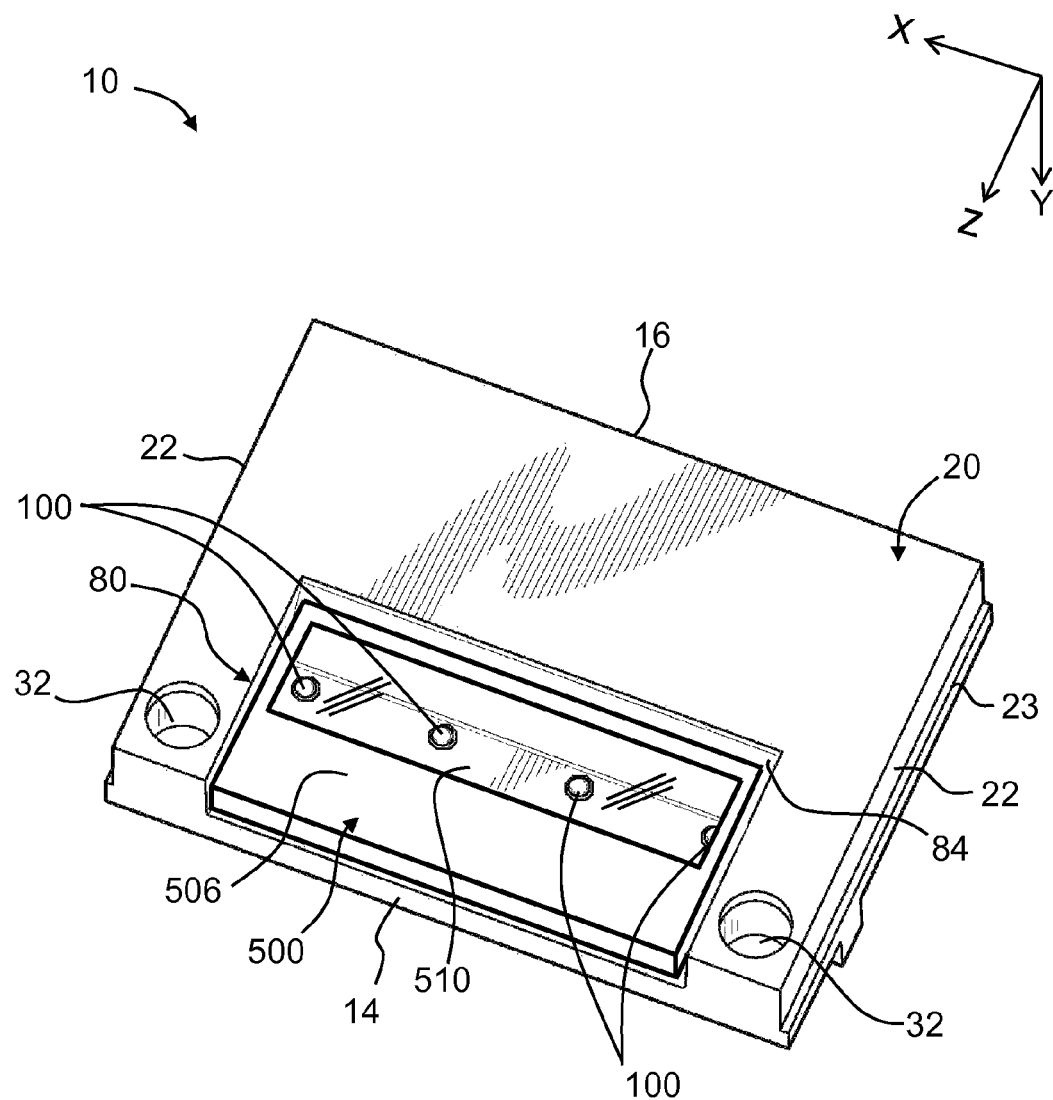
FIG. 14 is similar to FIG. 2, and illustrates an example embodiment wherein a window unit 500 is disposed in the recess of the fiber optic interface module to maintain an air interface at the lens surface 102.
Figure 15A:
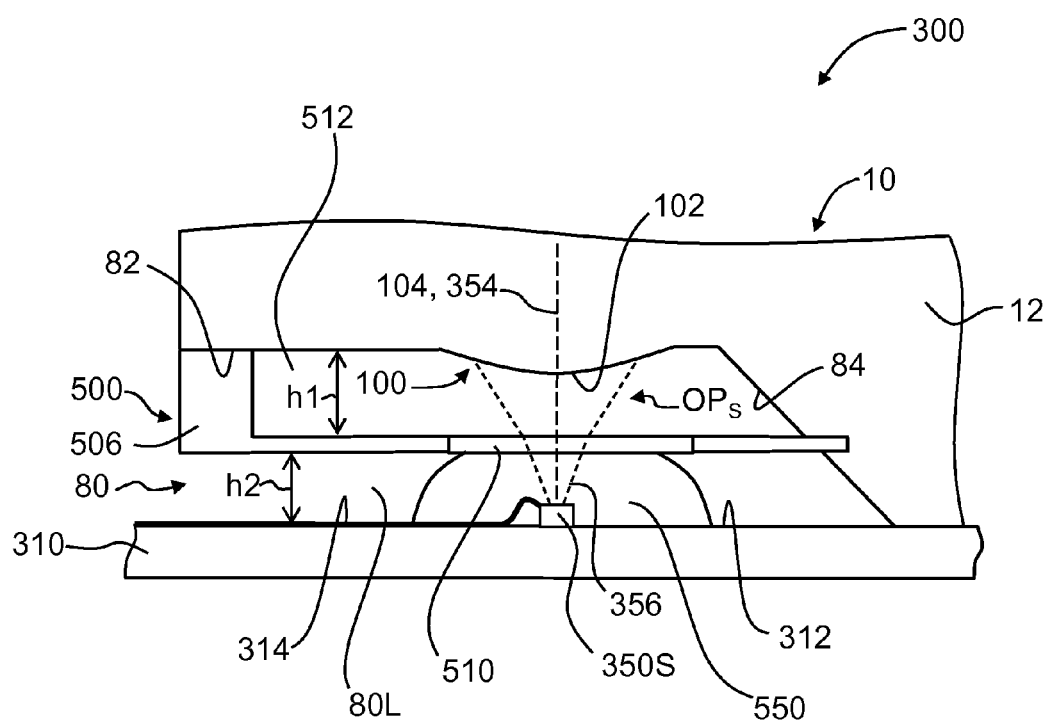
FIG. 15A is a close-up cross-sectional view similar to FIG. 4 and shows the window unit of FIG. 14 disposed in recess 80 between the printed circuit board upper surface and the recess ceiling.

FIG. 14 is similar to FIG. 2, and illustrates an example embodiment wherein a window unit 500 is disposed in recess 80 of module 10 to maintain an air interface at lens surface 102. FIG. 15A is a close-up cross-sectional view similar to FIG. 4 and shows the example window unit of FIG. 14 disposed in recess 80 between PCB 310 and recess ceiling 82. An example window unit 500 includes a frame 506 that supports a window 510 that is transparent to light 356. The window frame 506 and window 510 define a window unit interior 512.

In the example of FIG. 15A, frame 506 is configured to be secured to ceiling 82 of recess 80 so that widow 510 resides at a height h1 from the ceiling 82. The window unit 500 serves to define a lower recess section 80L within recess 80. Lower recess section 80L is sized to accommodate a high-index material 550 that covers light source 350S. In an example, high-index material 550 serves to enhance the light-emitting capability of light source 350S and in an example is a globule of gel or epoxy. The high-index material 550 can also be used to cover photodetector 350D in essentially the same manner, and the discussion of window unit 500 relates generally to either type of active photo-device 350.

Note however that high-index material 550 cannot fill recess 80 to ceiling 82 within source optical path $OP_S$ because an air interface is required adjacent lens surface 102 for lens 100 to have sufficient optical power. To this end, window unit 500 serves to keep globule 550 within lower recess section 80L so that the window unit interior 512 remains filled with air. The window 510 allows for light to be transmitted through window unit interior 512. In this configuration, window unit interior 512 contains high-index material 550 and defines an upper recess section 80U that remains filled with air.

Figure 15B:
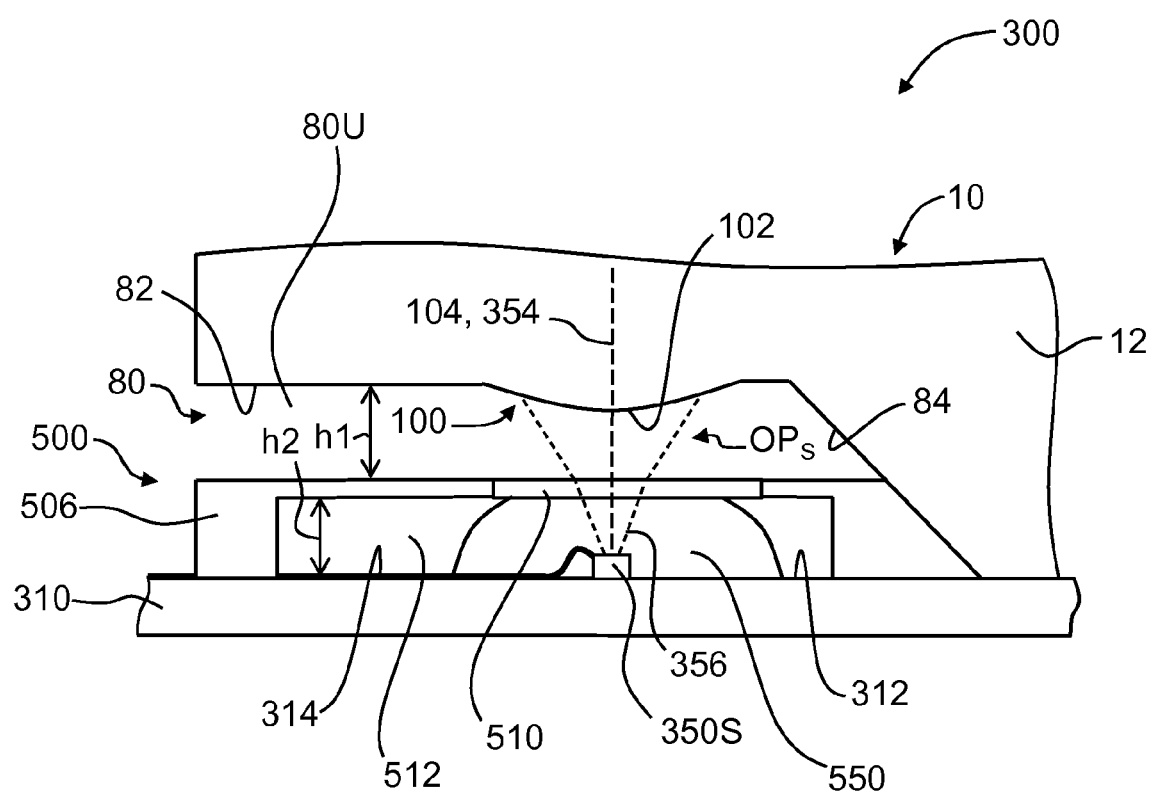
FIG. 15B is similar to FIG. 15A and illustrates an example embodiment of the window unit where the window unit frame is configured to be supported by the upper surface of the printed circuit board.

Other configurations for window frame 506 can be employed to support an air interface at lens surface 102. FIG. 15B is similar to FIG. 15A and shows an example embodiment of window unit 500 where frame 506 is configured to be supported by PCB upper surface 312.

Figure 16:
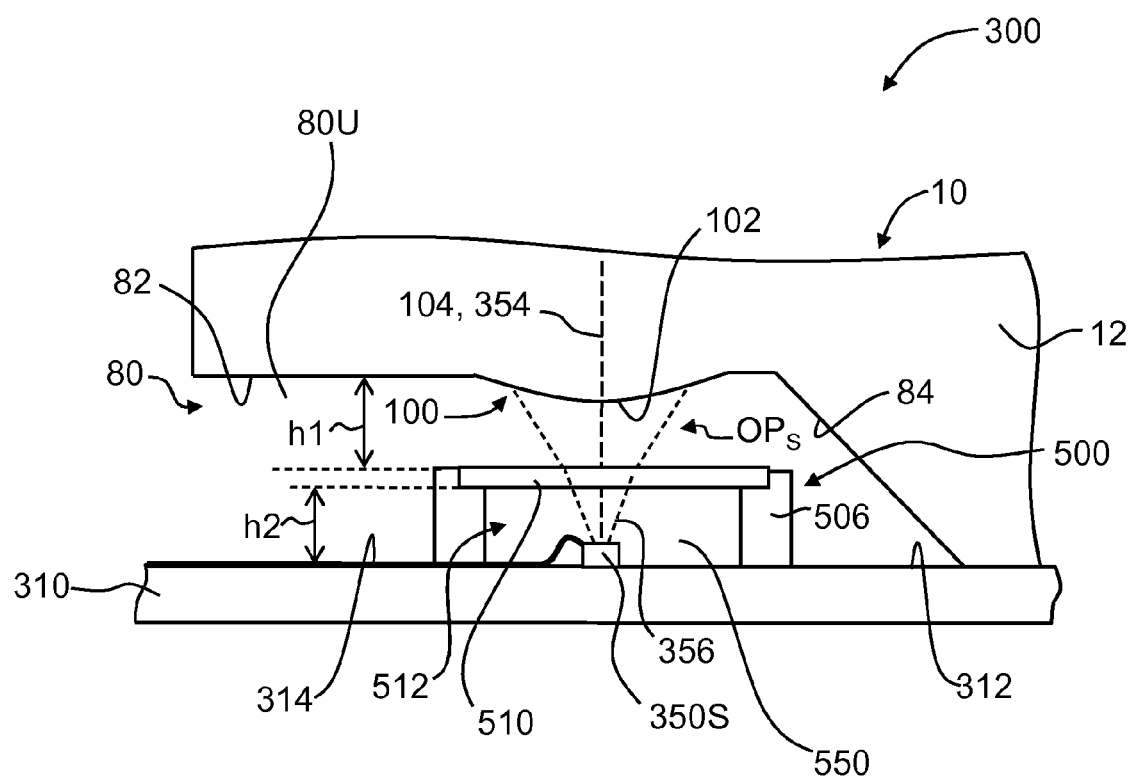
FIG. 16 is similar to FIG. 15A and FIG. 15B and shows another example embodiment of the window frame that is more compact, and wherein a globule fills essentially the entire lower recess section defined by the window unit.

FIG. 16 is similar to FIG. 15A and FIG. 15B, and shows another example of window frame 506 that is more compact, and wherein globule 550 fills essentially the entire window unit interior 512. The window frame 506 can be secured to PCB upper surface 312 via a variety of means, including adhesive means or clip-on means.

Figure 17:
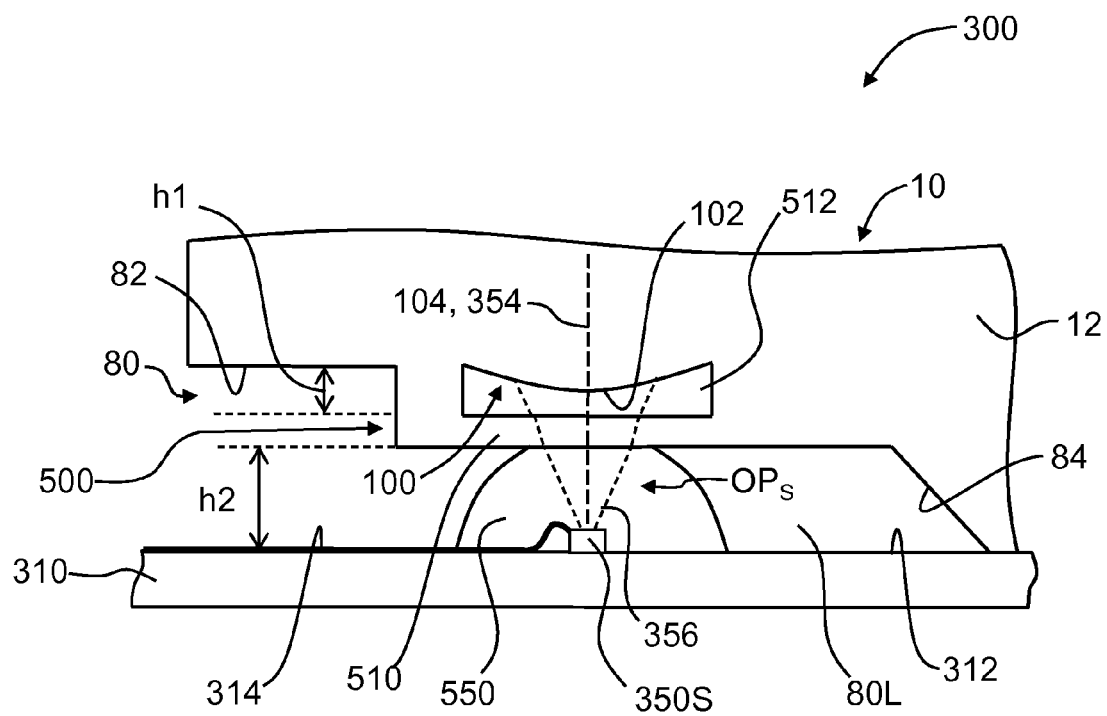
FIG. 17 is a view similar to FIG. 16 and illustrates an example embodiment of the window unit as formed as part of the module body.

FIG. 17 is a view similar to FIG. 16 and illustrates an example embodiment of window unit 500 formed as part of module body 12. The window unit 500 depends from ceiling 82 of recess 80 and is transparent to light 356. The window unit interior 512 surrounds lens surface 102 and provides the necessary air interface at the lens surface while allowing the lower recess section 80L to include index-matching material 550 that covers light source 350S. In an example embodiment, widow unit 500 of FIG. 17 is formed integrally with module body 12.

Although the embodiments herein have been described with reference to particular aspects and features, it is to be understood that these embodiments are merely illustrative of desired principles and applications. It is therefore to be understood that numerous modifications may be made to the illustrative embodiments and that other arrangements may be devised without departing from the spirit and scope of the appended claims.

What is claimed is:

1. A fiber optic interface module configured to provide optical communication of infrared light between a light source and an optical fiber having an end and a core, comprising:
   a module body that is substantially transparent to light having an infrared wavelength and that includes a top surface and a bottom surface, wherein the top surface defines a total-internal-reflection (TIR) mirror, an end wall, and optical fiber support feature that supports the optical fiber with the optical fiber end abutting the end wall, wherein the optical fiber support feature is a groove;
   a lens surface formed on the bottom surface of the module body and constitutes the only surface having optical power, wherein the lens surface, the TIR mirror, the end wall and an intervening portion of the module body define a lens having a folded optical axis comprising a source optical path $OP_s$ between the lens surface and the TIR mirror; and
   the lens surface having a shape that provides a theoretical coupling efficiency CE≥85% between the light source and the optical fiber and that defines a back focus that falls within the optical fiber core at a back focus distance F2 from the end of the optical fiber when the core of the optical fiber is operably supported in the optical fiber support feature such that the source optical path $OP_s$ can be laterally offset from a light-source axis of the light source by a lateral misalignment δZ.

2. The fiber optic interface module according to claim 1, wherein the lens shape is selected to provide a maximum tolerance to the lateral misalignment δZ that maintains the coupling efficiency of CE≥85%.

3. The fiber optic interface module according to claim 1, wherein the lens surface has a hyperbolic shape.

4. The fiber optic interface module according to claim 3, wherein the lens surface shape is defined by a radius R in the range of 80 microns≤R≤300 microns.

5. The fiber optic interface module according to claim 2, further comprising the optical fiber core having a parabolic gradient-index profile.

6. The fiber optic interface module according to claim 1, wherein the back focus distance F2 is in the range of 0≤F2≤500 μm.

7. A lens for coupling infrared light from a light source having a light-source axis to an optical fiber having an end and a core with a central axis that is substantially orthogonal to the light-source axis, the lens comprising along a lens axis:
   a lens body having a front lens surface with an aspherical shape and that constitutes an only surface having optical power and an only air interface for an optical path between the light source and the optical fiber;

the lens body further comprising a planar rear lens surface against which the optical fiber end abuts, wherein the optical fiber is supported by an optical support feature configured as a groove;
a total-internal-reflection (TIR) surface formed in the lens body between the front and rear lens surfaces that folds the lens axis so that the lens axis aligns with the orthogonal light source and central axes; and
a back focus that resides within the optical fiber core at a back focus distance F2 from the end of the optical fiber.

8. The lens according to claim 7, wherein the back focus distance F2≤500 microns.

9. The lens according to claim 8, wherein the back focus distance F2≤200 microns.

10. The lens according to claim 7, wherein the aspherical shape is hyperbolic.

11. The lens according to claim 7, further including the optical fiber core having a parabolic gradient-index profile.

12. The lens according to claim 7, wherein the front lens surface has a shape defined by a radius R in the range of 80 microns≤R≤300 microns.

13. The lens according to claim 7 wherein the aspheric shape provides a maximum tolerance to a lateral misalignment that maintains a coupling efficiency CE between the light source and the optical fiber of CE≥85%.

14. The lens according to claim 7, further comprising the light source and the optical fiber, wherein the light source comprises a vertical-cavity surface-emitting laser.

15. The lens according to claim 7, further comprising an index-matching material disposed between the end of the optical fiber and the planar rear lens surface.

16. The lens according to claim 7, further comprising the lens body being made of a resin that transmits infrared light in the wavelength range of 800 nm to 1,100 nm.

17. An optical system comprising:
a lens having a lens body with a lens axis, a front surface with an aspheric shape and that constitutes an only surface having optical power, and a planar rear surface, the lens body being substantially transparent to an infrared wavelength of light;
a total-internal-reflection (TIR) surface formed in the lens body between the front and rear lens surfaces that folds the lens axis by substantially 90 degrees;
an optical fiber having a core and an end, the optical fiber arranged with its end abutting the planar rear lens surface, with an optical support feature configured as a groove;
a light source disposed substantially at a front focus distance away from the front lens surface, the light source being configured to emit light having an infrared wavelength; and
a back focus that resides within the optical fiber core at the back focus distance F2 from the planar rear lens surface.

18. An optical system according to claim 17, wherein the back focus distance F2 is ≤500 microns.

19. The optical system according to claim 18, wherein the back focus distance F2≤200 microns.

20. The optical system according to claim 17, wherein the front surface has a shape defined by a radius R in the range of 80 microns≤R≤300 microns.

21. The optical system according to claim 17, wherein the optical fiber core has a parabolic gradient-index profile.

22. The lens according to claim 17, wherein the shape of the front lens surface provides a maximum tolerance to a lateral misalignment of the light source relative to the lens axis while maintaining a coupling efficiency CE between the light source and the optical fiber of CE≥85%.

23. The lens according to claim 17, wherein the light source comprises a vertical-cavity surface-emitting laser.

24. The lens according to claim 17, wherein the lens has an axial thickness d2 between the front and the rear surfaces in the range of 400 microns≤d2≤1,600 microns.

25. The lens according to claim 17, further comprising the lens body being made of a resin that transmits infrared light in the wavelength range of 800 nm to 1,100 nm.

26. A fiber optic interface module configured to provide optical communication of infrared light between a plurality of light sources and a plurality of optical fibers each having an end and a core, comprising:
a module body that is substantially transparent to the infrared light and that includes a top surface and a bottom surface, wherein the top surface defines a total-internal-reflection (TIR) mirror, an end wall, and optical fiber support features configured as grooves that operably support the plurality of optical fibers, with the optical fiber ends abutting the end wall;
a plurality of lens surfaces formed on the bottom surface of the module body, wherein the lens surfaces, the TIR mirror, the end wall and intervening portions of the module body define a plurality of lenses each having a folded optical axis comprising a source optical path OP between the corresponding lens surface and the TIR mirror, wherein the lens surface of each respective optical path is the only surface of the respective optical path having optical power; and
the lens surfaces each having a shape that provides a theoretical coupling efficiency CE≥85% between each light source and the corresponding optical fiber, the lens surfaces defining corresponding back focuses that fall within the optical fiber core of the corresponding optical fibers at respective back focus distances F2 from the end of the corresponding optical fibers when the optical fibers are operably supported one each in the optical fiber support features such that that the source optical path $OP_s$ of each lens of the plurality of lenses can be laterally offset from a light-source axis of a corresponding one of the plurality of light sources by a lateral misalignment.

* * * * *